(12) United States Patent
Tokunaga et al.

(10) Patent No.: US 8,216,915 B2
(45) Date of Patent: Jul. 10, 2012

(54) SOI SUBSTRATE AND MANUFACTURING METHOD THEREOF

(75) Inventors: Hajime Tokunaga, Kanagawa (JP); Naoki Okuno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/949,837

(22) Filed: Nov. 19, 2010

(65) Prior Publication Data

US 2011/0124179 A1 May 26, 2011

(30) Foreign Application Priority Data

Nov. 24, 2009 (JP) ................. 2009-266067

(51) Int. Cl.
*H01L 21/00* (2006.01)
(52) U.S. Cl. ............. 438/455; 438/458; 257/E21.568
(58) Field of Classification Search .......... 438/455, 438/458; 257/E21.568
See application file for complete search history.

(56) References Cited

U.S. PATENT DOCUMENTS

| | | | |
|---|---|---|---|
| 5,374,564 A | 12/1994 | Bruel | |
| 6,191,007 B1 | 2/2001 | Matsui et al. | |
| 6,306,729 B1 * | 10/2001 | Sakaguchi et al. | 438/458 |
| 6,380,019 B1 | 4/2002 | Yu et al. | |
| 6,380,046 B1 | 4/2002 | Yamazaki | |
| 7,199,024 B2 | 4/2007 | Yamazaki | |
| 7,601,601 B2 * | 10/2009 | Yamazaki et al. | 438/311 |
| 7,666,757 B2 * | 2/2010 | Ohnuma | 438/455 |
| 2002/0109144 A1 | 8/2002 | Yamazaki | |
| 2007/0134891 A1 | 6/2007 | Adetutu et al. | |
| 2007/0173000 A1 | 7/2007 | Yamazaki | |
| 2007/0298529 A1 * | 12/2007 | Maeda et al. | 438/33 |
| 2008/0242051 A1 | 10/2008 | Yamazaki et al. | |
| 2010/0081252 A1 | 4/2010 | Makino | |
| 2010/0120226 A1 | 5/2010 | Yamazaki et al. | |
| 2010/0291752 A1 | 11/2010 | Okuno | |
| 2010/0330779 A1 * | 12/2010 | Okuno et al. | 438/458 |
| 2011/0008946 A1 * | 1/2011 | Moriwaka | 438/458 |

FOREIGN PATENT DOCUMENTS

| | | |
|---|---|---|
| JP | 05-211128 | 8/1993 |
| JP | 11-45862 | 2/1999 |
| JP | 2005-252244 | 9/2005 |

* cited by examiner

*Primary Examiner* — Jarrett Stark
*Assistant Examiner* — Nicholas Tobergte
(74) *Attorney, Agent, or Firm* — Nixon Peabody LLP; Jeffrey L. Costellia

(57) ABSTRACT

The semiconductor substrate provided with a groove portion is irradiated with ions so that an embrittled region is formed in the semiconductor substrate, the semiconductor substrate and a base substrate are bonded to each other with an insulating layer interposed therebetween and a space which is surrounded by the groove portion in the semiconductor substrate and the base substrate is formed, and heat treatment is performed to separate the semiconductor substrate at the embrittled region, so that the semiconductor layer is formed over the base substrate with the insulating layer interposed therebetween.

9 Claims, 15 Drawing Sheets

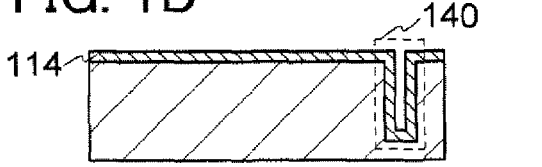
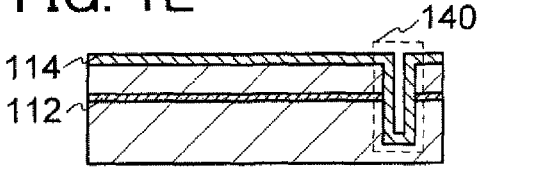
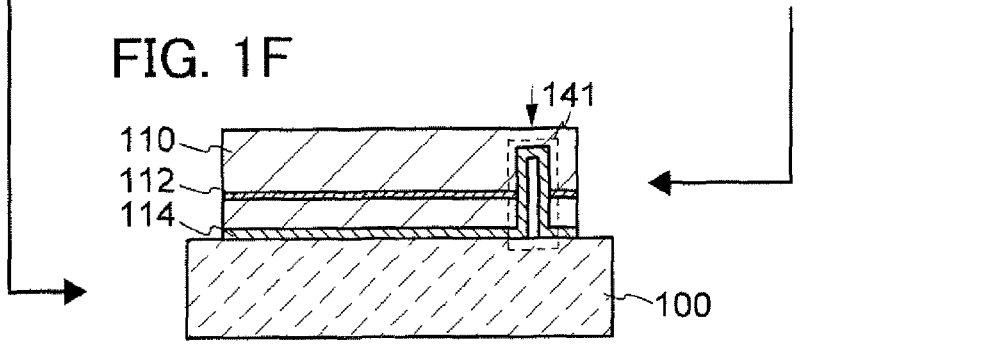
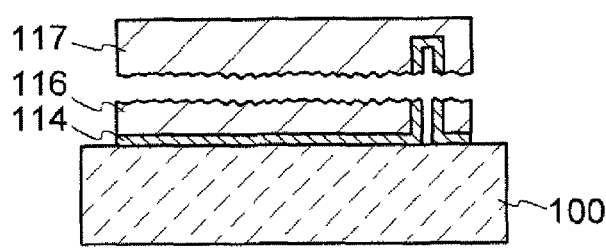
Reprocessing treatment FIG. 5A1
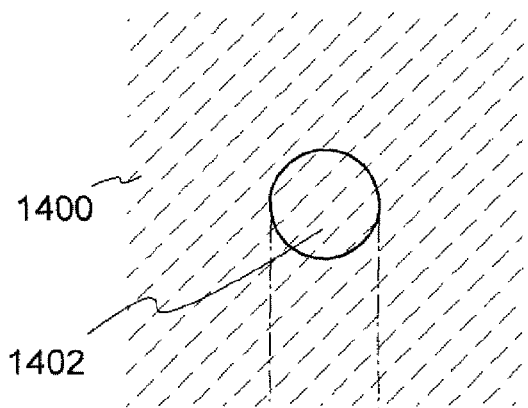
FIG. 5A2
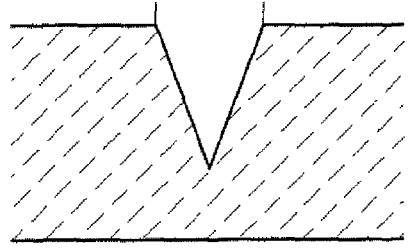
FIG. 5B1
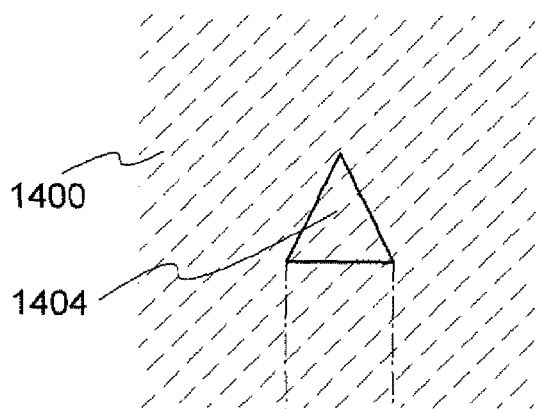
FIG. 5B2
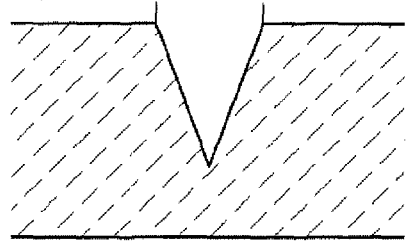
FIG. 5C1
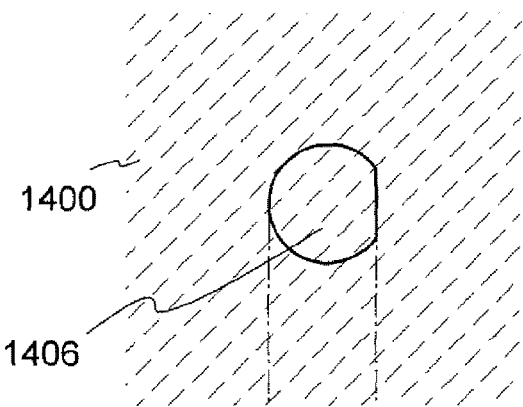
FIG. 5C2
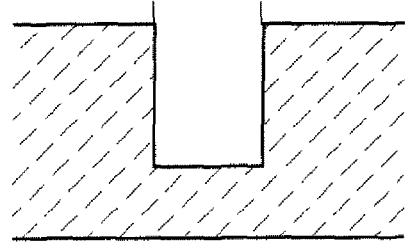
FIG. 5D1
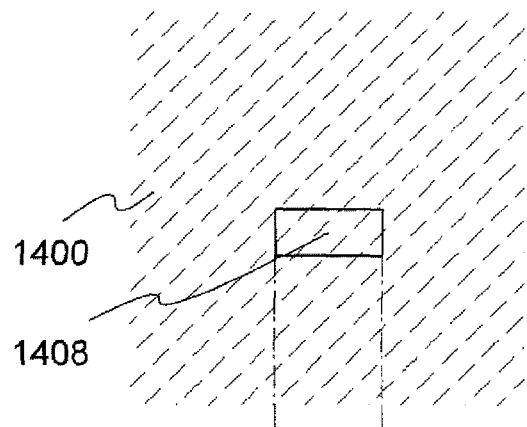
FIG. 5D2
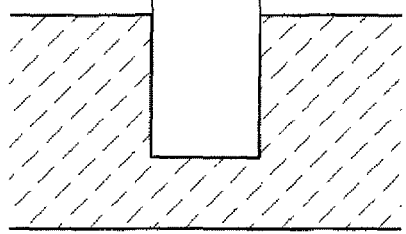

FIG. 9A
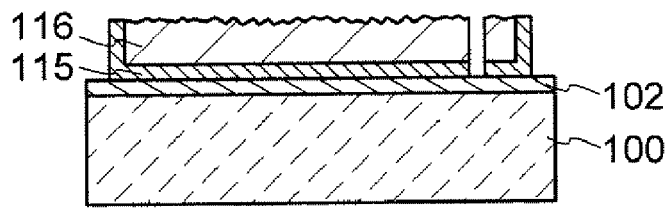
FIG. 9B
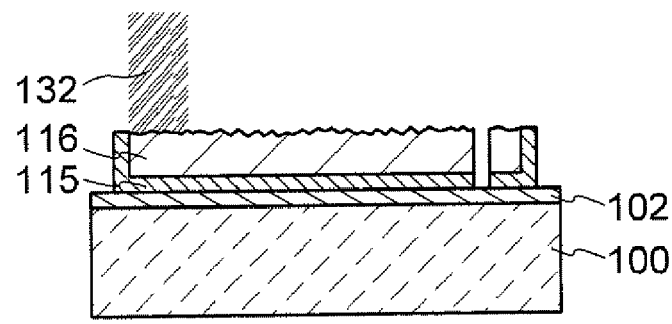
FIG. 9C
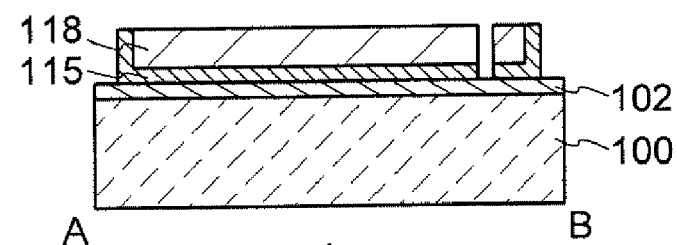
FIG. 9D
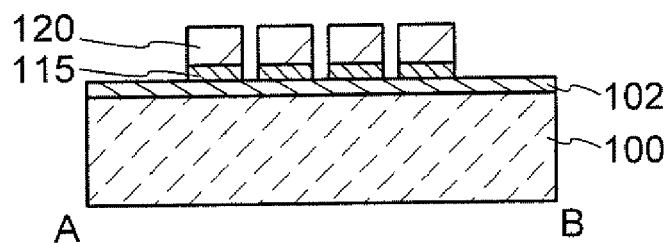

FIG. 11A
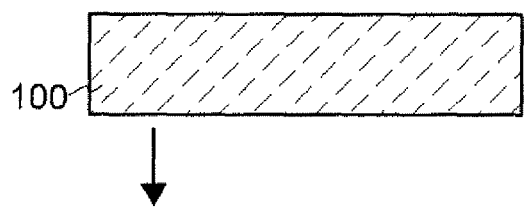
FIG. 11B
FIG. 11C
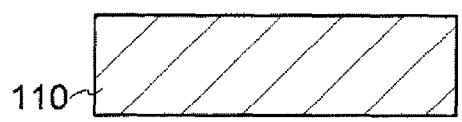
FIG. 11D
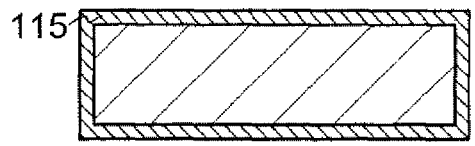
FIG. 11E
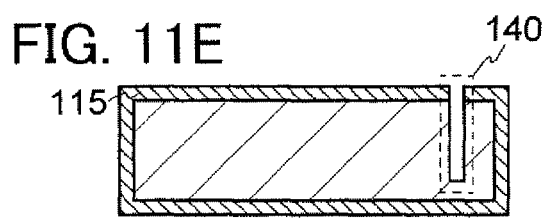
FIG. 11F
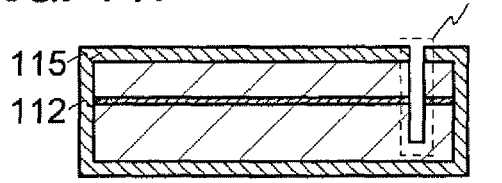
FIG. 11G
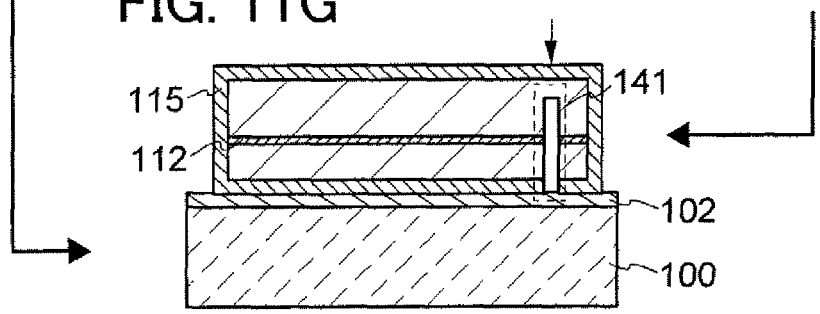
FIG. 11H
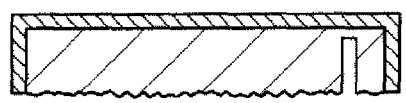
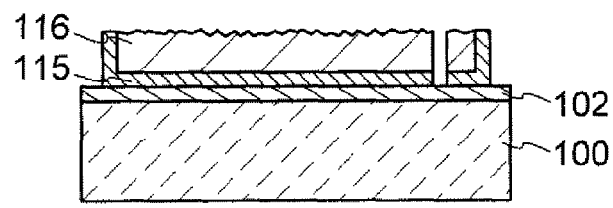

SOI SUBSTRATE AND MANUFACTURING METHOD THEREOF

BACKGROUND OF THE INVENTION

1. Field of the Invention

The present invention relates to a method for manufacturing a silicon-on-insulator (SOI) substrate, the SOI substrate, and a method for manufacturing a semiconductor device using the SOI substrate.

2. Description of the Related Art

In recent years, instead of a bulk silicon wafer, the use of a silicon-on-insulator (SOI) substrate where a thin single crystal semiconductor layer is provided over an insulating surface has been considered. Because parasitic capacitance generated by a drain of a transistor and a substrate can be reduced by use of an SOI substrate, SOI substrates are attracting attention as substrates which improve performance of semiconductor integrated circuits.

One of known methods for manufacturing SOI substrates is a Smart Cut (registered trademark) method (for example, see Patent Document 1). A summary of a method for manufacturing an SOI substrate by a Smart Cut method is described below. First, hydrogen ions are implanted into a silicon wafer by an ion implantation method; thus, a microbubble layer is formed at a predetermined depth from the surface. Next, the silicon wafer into which hydrogen ions have been implanted is bonded to another silicon wafer with a silicon oxide film interposed therebetween. After that, through heat treatment, part of the silicon wafer into which hydrogen ions are implanted is separated as a thin film along the microbubble layer. Accordingly, a single crystal silicon layer is formed over the other bonded silicon wafer.

A method for forming a single crystal silicon layer over a base substrate made of glass by using such a Smart Cut method has been proposed (for example, see Patent Document 2). Glass substrates may have larger sizes and are less expensive than silicon wafers; thus, glass substrates are mainly used in manufacturing liquid crystal display devices or the like. By using a glass substrate as a base substrate, a large-sized inexpensive SOI substrate can be manufactured.

REFERENCE

Patent Document

[Patent Document 1] Japanese Published Patent Application No. H05-211128
[Patent Document 2] Japanese Published Patent Application No. 2005-252244

SUMMARY OF THE INVENTION

As described above, in the case where an SOI substrate is used as a substrate for a display device such as a liquid crystal display device, it is necessary that an SOI substrate have a structure in which a single crystal silicon thin film is provided over a light-transmitting substrate. Further, in order to form an electronic device such as a TFT using the single crystal silicon thin film, it is preferable that the flatness of the single crystal silicon thin film be high.

In a method for manufacturing an SOI substrate (for example, Patent Document 2), a temperature higher than or equal to 400° C. and lower than or equal to 600° C. is employed for example, as the temperature of heat treatment performed when a single crystal silicon substrate and a glass substrate are separated at an embrittled region in the single crystal silicon substrate after being bonded to each other.

In the Smart Cut method, the following mechanism is used: in the embrittled region which is formed by addition of hydrogen ions, bubble growth due to gas aggregation is caused by heat treatment for separation at the embrittled region in the single crystal silicon substrate, and a single crystal silicon thin film is separated using this bubble growth. Bubbles tend to become large as the temperature at which the single crystal silicon thin film is separated becomes high, and surface roughness of the single crystal silicon thin film increases when the bubbles grow large. Such surface roughness induces various failures in a later step, which causes reduction in yield of semiconductor elements or semiconductor devices.

In view of the above problem, an object of one embodiment of the present invention is to suppress surface roughness of a semiconductor layer when an SOI substrate is manufactured by bonding a base substrate and a semiconductor substrate to each other. In addition, it is another object to provide a semiconductor device with high manufacturing yield by suppressing the roughness.

According to one embodiment of the present invention, a region where a semiconductor substrate and a base substrate are prevented from being bonded to each other by a groove portion (also referred to as a recessed portion) (the region also referred to as a region where gas is trapped) is formed in part (particularly, the periphery) of the surface which is to be bonded, in manufacturing an SOI substrate through the bonding. Details thereof will be described below.

One embodiment of the present invention is a method for manufacturing an SOI substrate, including the steps of irradiating a semiconductor substrate provided with a groove portion with ions to form an embrittled region in the semiconductor substrate, bonding the semiconductor substrate and a base substrate to each other with an insulating layer interposed therebetween and forming a space which is surrounded by the groove portion in the semiconductor substrate and the base substrate, and separating the semiconductor substrate at the embrittled region by heat treatment, so that a semiconductor layer is formed over the base substrate with the insulating layer interposed therebetween.

Note that the above method can also be described as follows. That is, one embodiment of the present invention is a method for manufacturing an SOI substrate, including the steps of irradiating a semiconductor substrate with accelerated ions to form an embrittled region in the semiconductor substrate, forming an insulating layer on at least one of the surfaces of the semiconductor substrate and a base substrate, bonding the semiconductor substrate and the base substrate to each other so that a space surrounded by a groove portion in the semiconductor substrate and the base substrate is formed in an inner region which is a peripheral portion of the semiconductor substrate and the base substrate and does not reach an end portion thereof, and generating a crack in the embrittled region using the space surrounded by the groove portion in the semiconductor substrate and the base substrate as a trigger by heat treatment to separate the semiconductor substrate, so that a semiconductor layer is formed over the base substrate.

In the above, it is desirable that heat treatment be performed to generate stress in the vicinity of the space which is surrounded by the groove portion in the semiconductor substrate and the base substrate and separate the semiconductor substrate at the embrittled region. In addition, the area of the groove portion (which refers to the cross-sectional area of a plane parallel to the surface of the substrate) is 1.0 mm$^2$ or more, desirably, 25 mm$^2$ or more. The depth of the recessed portion (also referred to as the groove portion) is greater than or equal to 1/100, preferably greater than or equal to 1/10, more preferably greater than or equal to ½, of the thickness of the semiconductor substrate. The groove portion may penetrate the semiconductor substrate.

In the above, the groove portion in the semiconductor substrate is desirably formed in a corner of the semiconductor substrate. Further, a groove portion may be formed in the base substrate at a position facing the groove portion in the semiconductor substrate. The bonding of the semiconductor substrate and the base substrate desirably proceeds from a position in the semiconductor substrate where the groove portion is provided.

In the above, the temperature of the heat treatment is desirably 500° C. or lower. The semiconductor layer provided over the base substrate is desirably subjected to laser light irradiation.

In general, the term "SOI substrate" means a semiconductor substrate where a silicon semiconductor layer is provided over an insulating surface. In this specification and the like, the term "SOI substrate" also includes a semiconductor substrate where a semiconductor layer formed using a material other than silicon is provided over an insulating surface in its category. That is, a semiconductor layer included in the "SOI substrate" is not limited to a silicon semiconductor layer. In addition, in this specification and the like, a semiconductor substrate means not only a substrate formed using only a semiconductor material but also all substrates including a semiconductor material. Namely, in this specification and the like, the "SOI substrate" is also included in the category of a semiconductor substrate.

Note that in this specification and the like, the term "single crystal" means a crystal in which, when a certain crystal axis is focused, the direction of the crystal axis is oriented in a similar direction in any portion of a sample. That is, the single crystal includes a crystal in which the direction of crystal axes is uniform as described above even when it includes a crystal defect or a dangling bond.

Further, in this specification and the like, the term "semiconductor device" means all devices which can operate by utilizing semiconductor characteristics. For example, a display device and an integrated circuit are included in the category of the semiconductor device. Furthermore, in this specification and the like, the display device includes a light emitting display device, a liquid crystal display device, and a display device including an electrophoretic element. A light emitting device includes a light emitting element, and a liquid crystal display device includes a liquid crystal element. The light-emitting element includes in its category an element whose luminance is controlled by a current or a voltage, and specifically includes an inorganic electroluminescent (EL) element, an organic EL element, and the like.

According to one embodiment of the disclosed invention, a region where gas is trapped is formed in part (the periphery) of the surface to be bonded. Accordingly, an SOI substrate having a semiconductor layer of which surface roughness is suppressed can be provided. In addition, the yield of a semiconductor device using such an SOI substrate can be increased.

A semiconductor substrate can be used plural times by being subjected to reprocessing treatment, so that cost for manufacturing an SOI substrate can be sufficiently reduced.

BRIEF DESCRIPTION OF THE DRAWINGS

FIGS. 1A to 1G are cross-sectional views illustrating an example of a method for manufacturing an SOI substrate.

FIGS. 5A1 and 5A2, 5B1 and 5B2, 5C1 and 5C2, and 5D1 and 5D2 are views illustrating examples of the shape of a groove portion.

FIGS. 9A to 9D are cross-sectional views illustrating an example of a method for manufacturing an SOI substrate.

FIGS. 11A to 11H are cross-sectional views illustrating an example of a method for manufacturing an SOI substrate.

DETAILED DESCRIPTION OF THE INVENTION

Figure 2A:
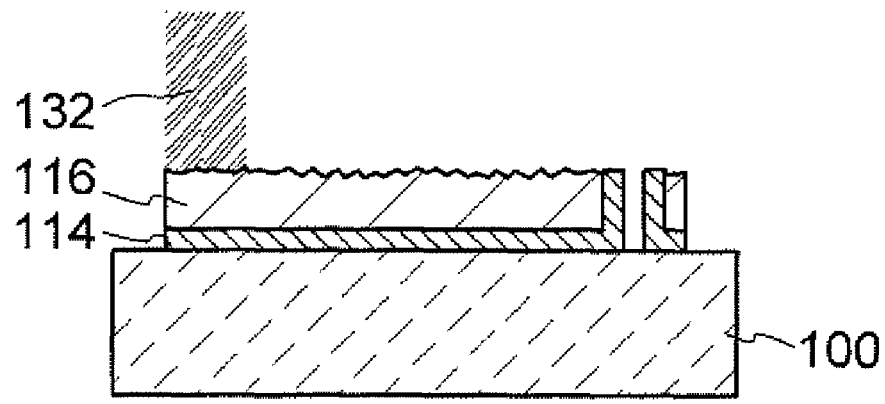
FIGS. 2A to 2C are cross-sectional views illustrating an example of a method for manufacturing an SOI substrate.

Hereinafter, Embodiments are described in detail using the drawings. Note that the present invention is not limited to the description of the embodiments, and it is apparent to those skilled in the art that modes and details can be modified in various ways without departing from the spirit of the present invention disclosed in this specification and the like. A structure of the different embodiment can be implemented by combination appropriately. Note that in structures of the present invention described below, common portions and portions having a similar function are denoted by the same reference numerals in all diagrams, and description thereof is omitted.

Embodiment 1

In this embodiment, an example of a method for manufacturing an SOI substrate will be described with reference to drawings. Specifically, the case of manufacturing an SOI substrate in which a single crystal semiconductor layer is provided over a base substrate will be described.

First, a base substrate 100 and a semiconductor substrate are prepared (see FIGS. 1A and 1B). In this embodiment, the case where a single crystal semiconductor substrate 110 is used as the semiconductor substrate is described.

FIG. 1A illustrates the base substrate 100. As the base substrate 100, a substrate formed of an insulator can be used. Specific examples thereof are as follows: a variety of glass substrates used in the electronics industry, such as substrates of aluminosilicate glass, aluminoborosilicate glass, and barium borosilicate glass; a quartz substrate; a ceramic substrate; and a sapphire substrate. Note that when the above-mentioned glass substrate contains a larger amount of barium oxide (BaO) than boric acid, more-practical heat-resistant glass can be obtained. Therefore, it is preferable that a glass substrate containing more BaO than $B_2O_3$ be used when the glass substrate needs to have heat resistance. Note that in this embodiment, a description is given of the case where a glass substrate is used as the base substrate 100. When a glass substrate which can have a larger size and is inexpensive is used as the base substrate 100, a cost reduction can be achieved.

Alternatively, a semiconductor substrate such as a single crystal silicon substrate or a single crystal germanium substrate may be used as the base substrate 100. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

FIG. 1B illustrates the single crystal semiconductor substrate 110. As the single crystal semiconductor substrate 110, a single crystal semiconductor substrate formed using an element belonging to Group 14 of the periodic table, such as a single crystal silicon substrate, a single crystal germanium substrate, or a single crystal silicon germanium substrate, can be used. Further, a compound semiconductor substrate using gallium arsenide, indium phosphide, or the like can be used. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape of the single crystal semiconductor substrate 110 is not limited to a circular shape and a single crystal semiconductor substrate which is processed into a rectangular shape can also be used. Further, the single crystal semiconductor substrate 110 can be manufactured by a Czochralski (CZ) method or a floating zone (FZ) method.

Note that in this embodiment, the case of using a single crystal semiconductor substrate as a semiconductor substrate is described; however, one embodiment of the disclosed invention should not be construed as being limited to this structure. For example, as a semiconductor substrate, a polycrystalline semiconductor substrate or the like may be used.

In view of removal of contaminants, it is preferable that a surface of the single crystal semiconductor substrate 110 be cleaned with a sulfuric acid/hydrogen peroxide mixture (SPM), an ammonium hydroxide/hydrogen peroxide mixture (APM), a hydrochloric acid/hydrogen peroxide mixture (HPM), diluted hydrofluoric acid (DHF), ozone water, or the like. Dilute hydrofluoric acid and ozone water may be discharged alternately for cleaning.

Next, a recessed portion 140 (also referred to as a groove portion) is formed in a region corresponding to the periphery of the single crystal semiconductor substrate 110 serving as a bond substrate (see FIG. 1C). As a method for forming the recessed portion 140, a mask is formed over the single crystal semiconductor substrate 110 and the single crystal semiconductor substrate 110 is selectively removed. A resist mask may be used as the mask which is formed over the single crystal semiconductor substrate 110. As a method for forming the recessed portion, for example, a wet etching method, a dry etching method, or a combination of a wet etching method and a dry etching method, a laser processing method, an ultrasonic processing method, a drill processing method, a microblast processing method, or the like may be used. The depth of the recessed portion 140 is greater than or equal to $1/100$, preferably greater than or equal to $1/10$, more preferably greater than or equal to $1/2$, of the thickness of the single crystal semiconductor substrate 110. The recessed portion 140 may penetrate the single crystal semiconductor substrate 110.

FIGS. 5A1 and 5A2, 5B1 and 5B2, 5C1 and 5C2, and 5D1 and 5D2 illustrate specific shapes of the recessed portion provided in the single crystal semiconductor substrate. FIGS. 5A1 and 5A2 illustrate the case where a recessed portion 1402 in a single crystal semiconductor substrate 1400 has a conical shape. FIG. 5A1 is a plan view of the recessed portion 1402 in the single crystal semiconductor substrate 1400, and FIG. 5A2 is a cross-sectional view of the recessed portion 1402 in the single crystal semiconductor substrate 1400, of a plane which is perpendicular to the substrate surface. FIGS. 5B1 and 5B2 illustrate the case where a recessed portion 1404 in the single crystal semiconductor substrate 1400 has a triangular pyramidal shape. FIG. 5B1 is a plane view of the recessed portion 1404 in the single crystal semiconductor substrate 1400, and FIG. 5B2 is a cross-sectional view of the recessed portion 1404 in the single crystal semiconductor substrate 1400, of a plane which is perpendicular to the substrate surface. FIGS. 5C1 and 5C2 illustrate the case where a recessed portion 1406 in the single crystal semiconductor substrate 1400 has a substantially cylindrical shape whose part is lacked. FIG. 5C1 is a plan view of the recessed portion 1406 in the single crystal semiconductor substrate 1400, and FIG. 5C2 is a cross-sectional view of the recessed portion 1406 in the single crystal semiconductor substrate 1400, of a plane which is perpendicular to the substrate surface. FIGS. 5D1 and 5D2 illustrate the case where a recessed portion 1408 in the single crystal semiconductor substrate 1400 has a quadrangular prismatic shape. FIG. 5D1 is a plan view of the recessed portion 1408 in the single crystal semiconductor substrate 1400, and FIG. 5D2 is a cross-sectional view of the recessed portion 1408 in the single crystal semiconductor substrate 1400, of a plane which is perpendicular to the substrate surface. As described above, the shape of the recessed portion in the single crystal semiconductor substrate includes a conical shape, a polygonal pyramidal shape such as a triangular pyramidal shape or a quadrangular pyramidal shape, a cylindrical shape, or a polygonal prism shape such as a triangular prismatic shape or a quadrangular prismatic shape. Further, the conical shape and the cylindrical shape include in their respective categories a substantially conical shape and a substantially cylindrical shape each of which part is lacked, respectively.

Next, an insulating layer 114 is formed over the single crystal semiconductor substrate 110 (see FIG. 1D). The insulating layer 114 can be formed using a single layer of an insulating layer such as a silicon oxide film, a silicon oxynitride film, a silicon nitride film, or a silicon nitride oxide film, or a stacked layer of any of these films. These films can be formed by a thermal oxidation method, a CVD method, a sputtering method, or the like. Note that the insulating layer 114 is not necessarily provided on the side surface and the bottom surface of the recessed portion 140.

Note that in this specification and the like, the term oxynitride refers to a substance that contains more oxygen (atoms) than nitrogen (atoms). For example, silicon oxynitride is a substance including oxygen, nitrogen, silicon, and hydrogen in ranges of greater than or equal to 50 at. % and less than or equal to 70 at. %, greater than or equal to 0.5 at. % and less than or equal to 15 at. %, greater than or equal to 25 at. % and less than or equal to 35 at. %, and greater than or equal to 0.1 at. % and less than or equal to 10 at. %, respectively. Further, the term nitride oxide refers to a substance that contains more nitrogen (atoms) than oxygen (atoms). For example, silicon nitride oxide is a substance including oxygen, nitrogen, silicon, and hydrogen in ranges of greater than or equal to 5 at. % and less than or equal to 30 at. %, greater than or equal to 20 at. % and less than or equal to 55 at. %, greater than or equal to 25 at. % and less than or equal to 35 at. %, and greater than or equal to 10 at. % and less than or equal to 30 at. %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). Moreover, the total for the content ratio of the constituent elements is maximum at 100 at. %.

Next, an embrittled region 112 is formed at a predetermined depth from the surface of the single crystal semiconductor substrate 110 (see FIG. 1E).

The embrittled region 112 formed in the single crystal semiconductor substrate 110 at a predetermined depth from the surface can be formed by irradiating the single crystal semiconductor substrate 110 with an ion beam including hydrogen ions or the like having kinetic energy. The depth at which the embrittled region 112 is formed can be controlled by the kinetic energy, mass, charge, or incidence angle of the ions, or the like. The embrittled region 112 is formed at approximately the same depth as the average penetration depth of the ions. Therefore, the thickness of a single crystal semiconductor layer to be separated from the single crystal semiconductor substrate 110 can be adjusted with the depth at which the ions are introduced. For example, the average penetration depth may be controlled such that the thickness of a single crystal semiconductor layer is approximately greater than or equal to 10 nm and less than or equal to 500 nm, preferably, greater than or equal to 50 nm and less than or equal to 200 nm.

The above-described irradiation treatment with an ion beam can be performed with an ion-doping apparatus or an ion-implantation apparatus. As a typical example of the ion-doping apparatus, there is a non-mass-separation type apparatus in which plasma excitation of a process gas is performed and an object to be processed is irradiated with an ion beam including all kinds of ion species generated. In this apparatus, ion species in plasma are introduced into the object to be processed without being mass-separated. In contrast, an ion implantation apparatus is a mass-separation apparatus. The ion implantation apparatus is an apparatus for irradiating an object to be processed with an ion beam including ion species having a specific mass with mass separation of ion species in plasma.

In this embodiment, an example in which hydrogen is introduced into the single crystal semiconductor substrate 110 with the use of an ion-doping apparatus is described. A gas containing hydrogen is used as a source gas. As for ions to be introduced, the proportion of $H_3^+$ is preferably set high. Specifically, it is preferable that the proportion of $H_3^+$ be set 50% or higher (more preferably, 80% or higher) with respect to the total amount of $H^+$, $H_2^+$, and $H_3^+$. Introduction efficiency of ions can be improved by increasing the proportion of $H_3^+$.

Note that ions to be introduced are not limited to ions of hydrogen. Ions of helium or the like may be introduced. Ions to be introduced are not limited to one kind, and plural kinds of ions may be introduced. For example, in the case of performing introduction of hydrogen and helium concurrently using an ion doping apparatus, the number of steps can be reduced as compared to the case of performing introduction of hydrogen and helium in separate steps, and surface roughness of a single crystal semiconductor layer to be formed later can be further suppressed.

Here, surface treatment is preferably performed on surfaces to be bonded before the single crystal semiconductor substrate 110 and the base substrate 100 are bonded to each other. Surface treatment can improve the bonding strength at the bonding interface between the single crystal semiconductor substrate 110 and the base substrate 100.

As examples of the surface treatment, wet treatment, dry treatment, and combination of wet treatment and dry treatment can be given. Different wet treatments or different dry treatments may be combined to be performed.

As examples of the wet treatment, ozone treatment using ozone water (ozone water cleaning), megasonic cleaning, two-fluid cleaning (method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The above-described surface treatment on an object to be processed (a single crystal semiconductor substrate, an insulating layer formed over a single crystal semiconductor substrate, a support substrate, or an insulating layer formed over a support substrate) has an effect of improving the hydrophilicity and cleanliness of the surface of the object to be processed. As a result, the bonding strength between the substrates can be improved.

The wet treatment is effective for the removal of macro dust and the like attached to a surface of the object to be processed. The dry treatment is effective for the removal or decomposition of micro dust such as an organic substance attached to a surface of the object to be processed. The case in which the dry treatment such as ultraviolet treatment is performed and then the wet treatment such as cleaning is performed is preferable because the surface of the object to be processed can be made clean and hydrophilic and generation of watermarks on the surface of the object to be processed can be suppressed.

As the dry treatment, it is preferable to perform surface treatment using ozone or oxygen in an active state such as singlet oxygen. Ozone or oxygen in an active state such as singlet oxygen enables organic substances attached to the surface of the object to be processed to be removed or decomposed effectively. Further, the treatment using ozone or oxygen in an active state such as singlet oxygen may be combined with treatment using ultraviolet light having a wavelength of less than 200 nm, so that the organic substances attached to the surface of the object to be processed can be removed more effectively. Specific description thereof will be made below.

For example, irradiation with ultraviolet light in an atmosphere containing oxygen is performed to perform the surface treatment of the object to be processed. Irradiation with ultraviolet light having a wavelength of less than 200 nm and ultraviolet light having a wavelength of greater than or equal to 200 nm in an atmosphere containing oxygen may be performed, so that ozone and singlet oxygen can be generated. Alternatively, irradiation with ultraviolet light having a wavelength of less than 180 nm may be performed, so that ozone and singlet oxygen can be generated.

Examples of reactions which occur by performing irradiation with ultraviolet light having a wavelength of less than 200 nm and ultraviolet light having a wavelength of greater than or equal to 200 nm in an atmosphere containing oxygen are described.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the above reaction formula (1), irradiation with ultraviolet light (hv) having a wavelength ($\lambda_1$ nm) of less than 200 nm in an atmosphere containing oxygen ($O_2$) is performed to generate an oxygen atom ($O(^3P)$) in a ground state. Next, in the reaction formula (2), an oxygen atom ($O(^3P)$) in a ground state and oxygen ($O_2$) react with each other to generate ozone ($O_3$). Then, in the reaction formula (3), irradiation with ultraviolet light having a wavelength ($\lambda_2$ nm) of greater than or equal to 200 nm in an atmosphere containing generated ozone ($O_3$) is performed to generate singlet oxygen $O(^1D)$ in an excited state. In an atmosphere containing oxygen, irradiation with ultraviolet light having a wavelength of less than 200 nm is performed to generate ozone while irradiation with ultraviolet light having a wavelength of greater than or equal to 200 nm is performed to generate singlet oxygen by decomposing ozone. The above-described surface treatment can be performed by, for example, irradiation with a low-pressure mercury lamp ($\lambda_1$=185 nm, $\lambda_2$=254 nm) in an atmosphere containing oxygen.

An example of the reaction which is caused by the irradiation with ultraviolet light having a wavelength of less than 180 nm in an atmosphere containing oxygen is described below.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the above reaction formula (4), irradiation with ultraviolet light having a wavelength ($\lambda_3$ nm) of less than 180 nm in an atmosphere containing oxygen ($O_2$) is performed to generate singlet oxygen $O(^1D)$ in an excited state and an oxygen atom ($O(^3P)$) in a ground state. Next, in the reaction formula (5), an oxygen atom ($O(^3P)$) in a ground state and oxygen ($O_2$) react with each other to generate ozone ($O_3$). In the reaction formula (6), irradiation with ultraviolet light having a wavelength ($\lambda_3$ nm) of less than 180 nm in an atmosphere containing generated ozone ($O_3$) is performed to generate singlet oxygen in an excited state and oxygen. In an atmosphere containing oxygen, irradiation with ultraviolet light having a wavelength of less than 180 nm is performed to generate ozone and to generate singlet oxygen by decomposing ozone or oxygen. The above-described surface treatment can be performed by, for example, irradiation with a Xe excimer UV lamp in an atmosphere containing oxygen.

Chemical bonding of an organic substance or the like attached to the surface of an object to be processed is cut by the ultraviolet light having a wavelength of less than 200 nm, and the organic substance attached to the surface of the object to be processed, the organic substance whose chemical bonding is cut, or the like can be removed by oxidative decomposition with ozone or singlet oxygen. The surface treatment as described above can enhance the hydrophilicity and cleanliness of the surface of the object to be processed, making the bond more preferable.

Next, the base substrate 100 and the single crystal semiconductor substrate 110 are bonded to each other with the insulating layer 114 interposed therebetween (see FIG. 1F). By bonding the base substrate 100 and the single crystal semiconductor substrate 110 to each other with the insulating layer 114 interposed therebetween, a space 141 surrounded by the groove portion in the single crystal semiconductor substrate 110 and the base substrate 100 is formed. Bonding is performed as follows: the base substrate 100 and the single crystal semiconductor substrate 110 are disposed in close contact with each other with the insulating layer 114 therebetween, and then a pressure of greater than or equal to 1 N/cm² and less than or equal to 500 N/cm² is applied to a portion of the base substrate 100 or the single crystal semiconductor substrate 110. A bonding between the base substrate 100 and the insulating layer 114 is generated at the portion to which the pressure is applied and spontaneous bonding proceeds throughout almost the entire surface from the portion. This bonding is performed under the action of the Van der Waals force or hydrogen bonding and can be performed at room temperature.

It is preferable that the bonding proceed from the position of the recessed portion 140 provided in the single crystal semiconductor substrate 110 (see an arrow in FIG. 1F). The space 141 can be sealed by making the bonding proceed from the position. In addition, a region where the bonding is not performed can be reduced.

Note that heat treatment for increasing bonding strength may be performed after bonding. This heat treatment is performed at a temperature at which separation at the embrittled region 112 does not occur (for example, a temperature which is higher than or equal to room temperature and lower than 400° C.). Alternatively, the base substrate 100 and the insulating layer 114 may be bonded to each other while being heated at a temperature in this temperature range. The heat treatment can be performed using a diffusion furnace, a heating furnace such as a resistance heating furnace, a rapid thermal annealing (RTA) apparatus, a microwave heating apparatus, or the like.

Next, heat treatment is performed for separation of the single crystal semiconductor substrate 110 at the embrittled region 112, whereby a single crystal semiconductor layer 116 is formed over the base substrate 100 with the insulating layer 114 interposed therebetween (see FIG. 1G).

Here, the heat treatment for separating the single crystal semiconductor substrate 110 is performed at a temperature below the strain point of the base substrate 100. This heat treatment can be performed using a rapid thermal anneal (RTA) apparatus, a resistance heating furnace, a microwave heating apparatus, or the like. As the RTA apparatus, an RTA apparatus of a gas heating method using a heated gas (a gas rapid thermal anneal (GRTA) apparatus), an RTA apparatus of a lamp heating method (a lamp rapid thermal anneal (LRTA) apparatus), an RTA apparatus employing both a lamp heating method and a gas heating method, and the like can be given. In the case of using a GRTA apparatus, the temperature can be set at higher than or equal to 550° C. and lower than or equal to 650° C., and the treatment time can be set to longer than or equal to 0.5 minutes and shorter than or equal to 60 minutes. In the case of using a resistance heating furnace, the temperature can be set at higher than or equal to 200° C. and lower than or equal to 650° C., and the treatment time can be set to longer than or equal to 2 hours and shorter than or equal to 4 hours. Further, after the single crystal semiconductor substrate 110 is separated, heat treatment may be performed at a temperature of 500° C. or higher so that the concentration of hydrogen that remains in the single crystal semiconductor substrate 110 is reduced.

By the heat treatment, introduced atoms are separated out into voids which are formed in the embrittled region 112, and when the temperature or length of time of the heat treatment is increased and the amount of atoms separated out increases, excessive atoms become gas, whereby the internal pressure of the voids is increased. By the increased pressure, a crack is generated in the embrittled region 112, and accordingly, the single crystal semiconductor substrate 110 is separated at the embrittled region 112. Because the insulating layer 114 is bonded to the base substrate 100, the single crystal semiconductor layer 116 which is separated from the single crystal semiconductor substrate 110 remains over the base substrate 100. Note that because bonding is not performed at the recessed portion 140, the single crystal semiconductor layer 116 is not formed in a region of the base substrate 100, which corresponds to the recessed portion 140.

In the case where the space 141 which is surrounded by the recessed portion 140 in the single crystal semiconductor substrate 110 and the base substrate 100 is not provided, when the temperature or length of time of the heat treatment is increased and the amount of atoms separated out increases at the time of heat treatment, excessive atoms become gas, and the gas aggregates in the embrittled region 112. When the aggregated gas (bubbles) becomes large, the shape of the bubbles appears as it is as unevenness (roughness) of the surface of the single crystal semiconductor layer when the single crystal semiconductor substrate 110 is separated.

In one embodiment of the present invention, since the space 141 which is surrounded by the single crystal semiconductor substrate 110 and the base substrate 100 is formed, separation of the single crystal semiconductor substrate 110 can be triggered at the time of heat treatment. The temperature at which the single crystal semiconductor substrate 110 is separated can be suppressed by providing a trigger for the separation of the single crystal semiconductor substrate 110. The single crystal semiconductor substrate 110 can be separated before the aggregated gas (bubbles) in the embrittled region becomes large by suppressing the temperature at which the single crystal semiconductor substrate 110 is separated, whereby unevenness (roughness) of the surface of the single crystal semiconductor layer can be suppressed.

Next, a mechanism will be described in which the single crystal semiconductor substrate 110 provided with the recessed portion 140 is separated by heat treatment.

Figure 6A:
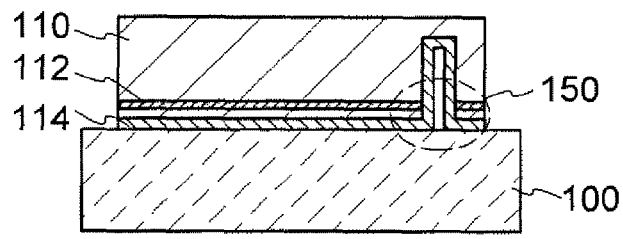
FIGS. 6A to 6D are cross-sectional views illustrating an example of a method for manufacturing an SOI substrate.

FIG. 6A illustrates the base substrate 100 and the single crystal semiconductor substrate 110 shortly after they are bonded to each other.

Figure 6B:
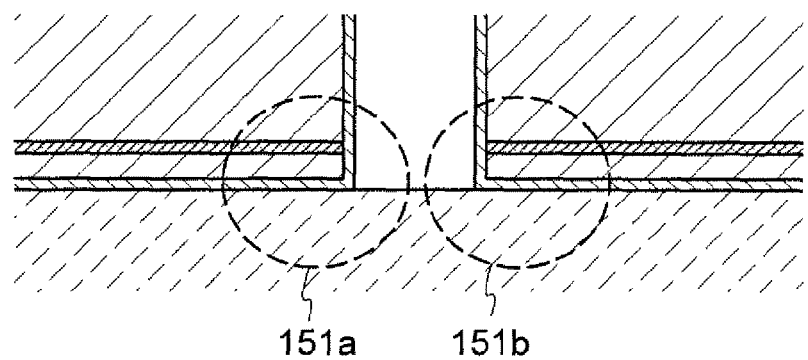

FIG. 6B illustrates a schematic view in which a vicinity of the bonding interface 150 between the base substrate 100 and the single crystal semiconductor substrate 110 illustrated in FIG. 6A is enlarged. As the temperature or length of time of the heat treatment is increased, stress concentration occurs in the vicinity of the bonding interface 150 (regions 151*a* and 151*b* which are close to the space) between the base substrate 100 and the single crystal semiconductor substrate 110. This stress concentration is influenced by a thermal expansion coefficient, modulus of rigidity, or the like of the base substrate 100 and the single crystal semiconductor substrate 110.

Figure 6C:
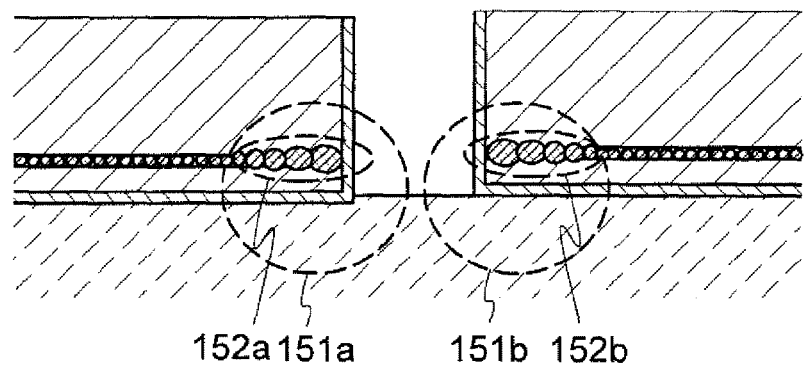
Figure 6D:
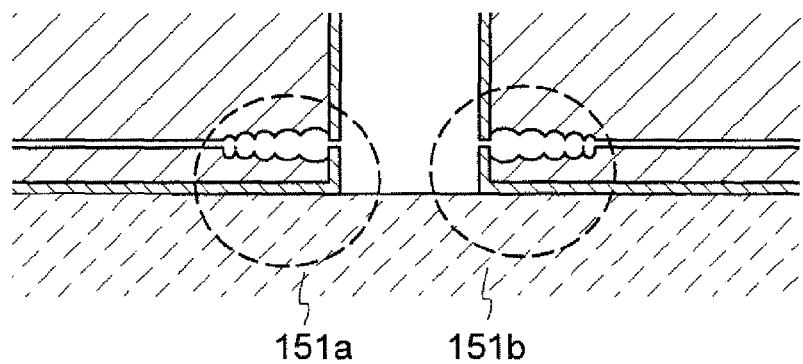

Bubble growth portions 152*a* and 152*b* are likely to be generated in a portion where such stress concentration occurs. Therefore, the bubble growth portions 152*a* and 152*b* (bubbles) can be made to grow locally by forming the portion where stress concentration occurs (see FIG. 6C). Thus, the bubble growth portions 152*a* and 152*b* are made to grow locally, whereby a crack is generated in the embrittled region as a trigger for separation of the single crystal semiconductor layer so that the single crystal semiconductor layer can be separated (see FIG. 6D). Thus, the single crystal semiconductor layer can be separated at a lower temperature compared to the case where a space is not provided. Since the single crystal semiconductor layer can be separated before the bubble growth portion grows largely within the substrate surface, surface roughness of the single crystal semiconductor layer can be suppressed. In addition, since the separation can be performed at a lower temperature as compared to the case of a single crystal semiconductor substrate which is not provided with a space, in a region other than the bubble growth portions 152*a* and 152*b*, local separation due to stress generated in the entire substrate, generation of minute cracks, and generation of surface roughness due to difficulty in smooth separation, which are caused by high heat treatment temperature, do not occur. Further, an effect can be expected that the amount of bent of the bonded substrate in the case where each substrate has a different thermal expansion coefficient is suppressed.

One embodiment of the present invention is effective in the case where materials or the like of substrates to be bonded are different, because the separation of the single crystal semiconductor layer is performed using stress concentration. Also in the case where substrates using the same material or the like are bonded to each other, a sufficient effect can be obtained in that surface roughness is suppressed.

In FIG. 1G, the single crystal semiconductor substrate 117 provided with the recessed portion 140 can be reused as the single crystal semiconductor substrate 110 serving as a bond substrate, by performing reprocessing treatment. The depth of the recessed portion 140 is greater than or equal to $\frac{1}{100}$, preferably greater than or equal to $\frac{1}{10}$, more preferably greater than or equal to $\frac{1}{2}$, of the thickness of the single crystal semiconductor substrate 110, or the recessed portion 140 penetrates the single crystal semiconductor substrate 110. Thus, the single crystal semiconductor substrate 117 can be used as the single crystal semiconductor substrate 110 illustrated in FIG. 1C which is provided with the recessed portion 140, after the reprocessing treatment.

Figure 2B:
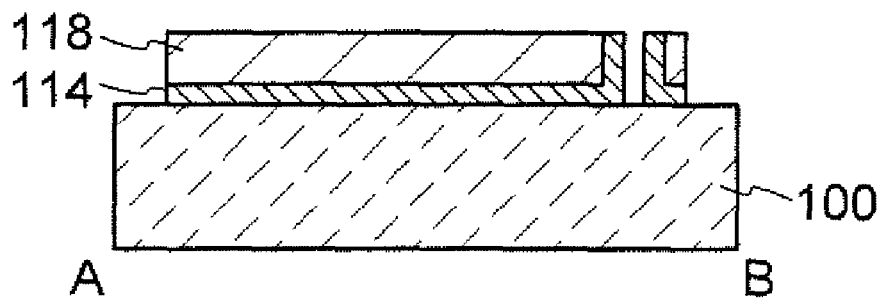
Figure 3A:
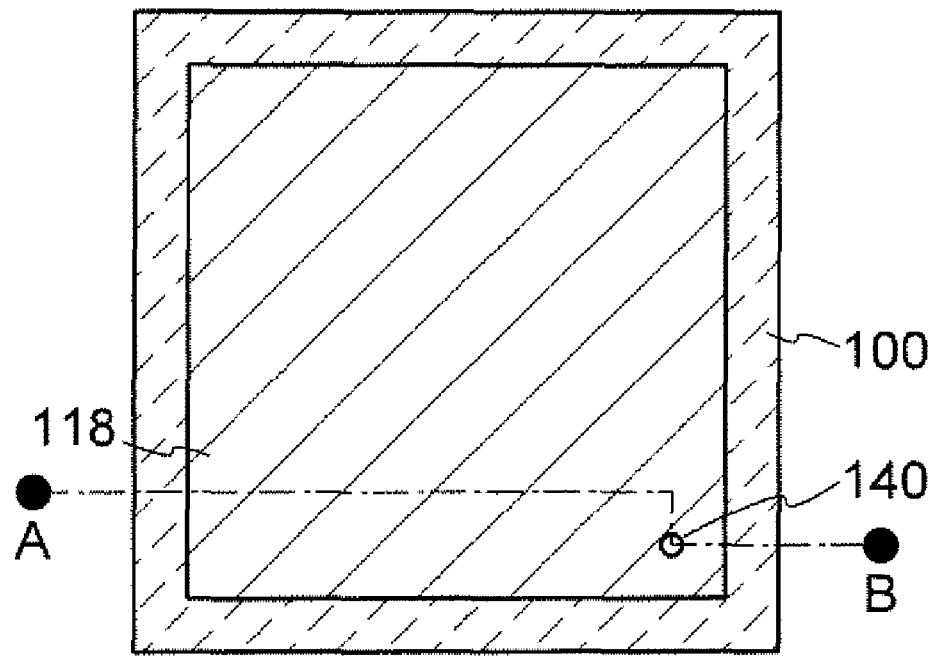
FIGS. 3A and 3B are plan views illustrating an example of a method for manufacturing an SOI substrate.

Next, the surface of the single crystal semiconductor layer 116 is irradiated with laser light 132, thereby forming a single crystal semiconductor layer 118 where the flatness of the surface is improved and the number of defects is reduced (see FIGS. 2A and 2B and FIG. 3A). FIG. 2B corresponds to a cross section taken along line A-B in FIG. 3A. Note that partial melting or complete melting is performed as melting of the single crystal semiconductor layer 116 by irradiation with the laser light 132. "Partial melting" means melting the single crystal semiconductor layer 116 by irradiation with the laser light 132 to a depth smaller than the depth to an interface on the insulating layer 114 side (i.e., smaller than the thickness of the single crystal semiconductor layer 116). In other words, it refers to a state in which the upper portion of the single crystal semiconductor layer 116 is melted to be in a liquid phase whereas the lower portion is not melted and remains in a solid phase. Further, "complete melting" means melting such that the single crystal semiconductor layer 116 is melted to be in the liquid state to the interface between the single crystal semiconductor layer 116 and the insulating layer 114.

It is preferable that the single crystal semiconductor layer 116 be partially melted by the irradiation with the laser light 132. This is because, if the single crystal semiconductor layer 116 is completely melted, it is microcrystallized due to disordered nucleation after being in a liquid phase, so that the crystallinity thereof decreases. On the other hand, partial melting allows crystal growth to be performed on the basis of a non-melted solid-phase portion; thus, the crystallinity can be improved as compared to the case where the single crystal semiconductor layer 116 is completely melted. In addition, incorporation of oxygen, nitrogen, or the like from the insulating layer 114 can be suppressed.

For the above-described laser light irradiation, a pulsed laser is preferably used. This is because high energy can be obtained and thus a partially melted state can easily be produced. The repetition rate is preferably, but not limited to, approximately greater than or equal to 1 Hz and less than or equal to 10 MHz. Examples of the pulsed laser include an Ar laser, a Kr, laser, an excimer laser (ArF, KrF, XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. Note that a continuous-wave laser may be used if it can cause partial melting. Example of the continuous-wave laser include an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

It is necessary that the wavelength of the laser light 132 is a wavelength which can be absorbed by the single crystal semiconductor layer 116. The wavelength may be determined in consideration of the skin depth of the laser light and the like. For example, the wavelength can be set in the range of greater than or equal to 250 nm and less than or equal to 700 nm. In addition, the energy density of the laser light 132 can be determined in consideration of the wavelength of the laser light 132, the skin depth of the laser light 132, the thickness of the single crystal semiconductor layer 116, or the like. The energy density of the laser light 132 may be set, for example, in the range of greater than or equal to 300 $mJ/cm^2$ and less than or equal to 800 $mJ/cm^2$. Note that the above range of the energy density is an example in the case where a XeCl excimer laser (wavelength: 308 nm) is used as the pulsed laser.

The irradiation with the laser light 132 can be performed in an atmosphere containing oxygen such as an air atmosphere or an inert atmosphere such as a nitrogen atmosphere or an argon atmosphere. In order to perform irradiation with the laser light 132 in an inert atmosphere, the irradiation with the laser light 132 may be performed in an airtight chamber while the atmosphere in the chamber is controlled. In the case where a chamber is not used, an inert atmosphere can be obtained by blowing an inert gas such as a nitrogen gas to the surface which is irradiated with the laser light 132.

Note that in the inert atmosphere such as nitrogen, the flatness of the single crystal semiconductor layer 118 can be improved more effectively than in the air atmosphere. In addition, in the inert atmosphere, generation of cracks and ridges can be suppressed more effectively than in the air atmosphere, and the applicable energy density range for the laser light 132 is widened. Note that irradiation with the laser light 132 may be performed in a reduced-pressure atmosphere. When irradiation with the laser light 132 is performed in a reduced-pressure atmosphere, the same effects as those obtained by the irradiation in an inert atmosphere can be obtained.

Although the irradiation treatment with the laser light 132 is performed just after the heat treatment for separation of the single crystal semiconductor layer 116 in this embodiment, one embodiment of the disclosed invention is not construed as being limited to this. After the heat treatment for separation of the single crystal semiconductor layer 116, etching treatment may be performed to remove a region including many defects at the surface of the single crystal semiconductor layer 116. Then, the irradiation treatment with the laser light 132 may be performed. Alternatively, after the flatness of the surface of the single crystal semiconductor layer 116 is improved, the irradiation treatment with the laser light 132 may be performed. Note that the etching treatment may be either wet etching or dry etching.

Further, although not described in this embodiment, a step of thinning the single crystal semiconductor layer 118 may be performed after the irradiation with the laser light 132 is performed as described above. In order to thin the single crystal semiconductor layer 118, one of dry etching and wet etching or a combination of both of the etchings may be employed.

Heat treatment at a temperature higher than or equal to 500° C. and lower than or equal to 700° C. may be performed on the single crystal semiconductor layer 118 after the irradiation treatment with the laser light or after the thinning process. By this heat treatment, the defects of the single crystal semiconductor layer 118, which are not repaired by irradiation with the laser light 132, can be eliminated and distortion of the single crystal semiconductor layer 118 can be relieved. For this heat treatment, as an RTA apparatus, a gas rapid thermal anneal (GRTA) apparatus which performs heat treatment using a high-temperature gas or a lamp rapid thermal anneal (LRTA) apparatus which performs heat treatment using lamp light can be used. For example, when a resistance heating furnace is used, a heat treatment may be performed at 600° C. for 4 hours.

Through the above steps, an SOI substrate having an excellent semiconductor layer where the surface roughness is reduced can be obtained (see FIG. 2B and FIG. 3A).

In this embodiment, the surface of the single crystal semiconductor layer 116 is irradiated with the laser light 132, whereby the single crystal semiconductor layer 118 where the flatness of the surface is improved and the number of defects is reduced can be obtained. Here, in the case where the surface of the single crystal semiconductor layer 116 is rough before the irradiation with the laser light 132, the film quality of the single crystal semiconductor layer 118 tends to deteriorate by the irradiation with the laser light 132. For example, even in the case where there are minute defects (such as partial chipping of the film) in the single crystal semiconductor layer 116, those defects tend to become larger by the irradiation with the laser light 132. It is considered that this is because a semiconductor in a region peripheral to the minute defects (a region where the single crystal semiconductor layer 116 is thin) is melted by the irradiation with the laser light 132 and the semiconductor in the region is moved by surface tension or the like.

Thus, in the case where the surface of the single crystal semiconductor layer 116 is rough, a defect due to the surface roughness tends to be caused; therefore, it is important to suppress surface roughness of the single crystal semiconductor layer 116. In particular, in the case where irradiation with the laser light 132 is employed, the following method described in this embodiment is extremely effective for planarization and the like of the single crystal semiconductor layer: the space 141 surrounded by the recessed portion 140 in the single crystal semiconductor substrate 110 and the base substrate 100 is formed and the single crystal semiconductor substrate is separated, whereby surface roughness of the single crystal semiconductor layer 116 is suppressed.

Figure 2C:
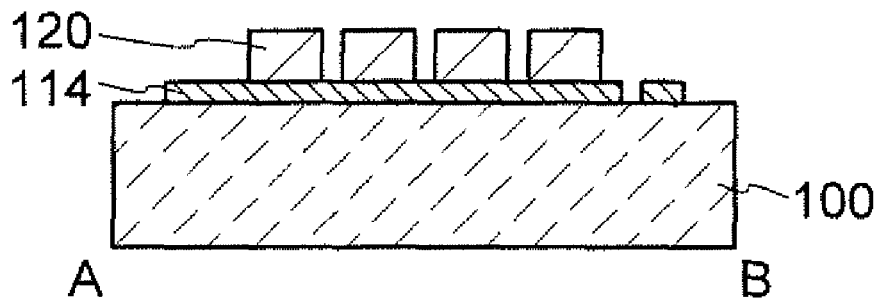
Figure 3B:
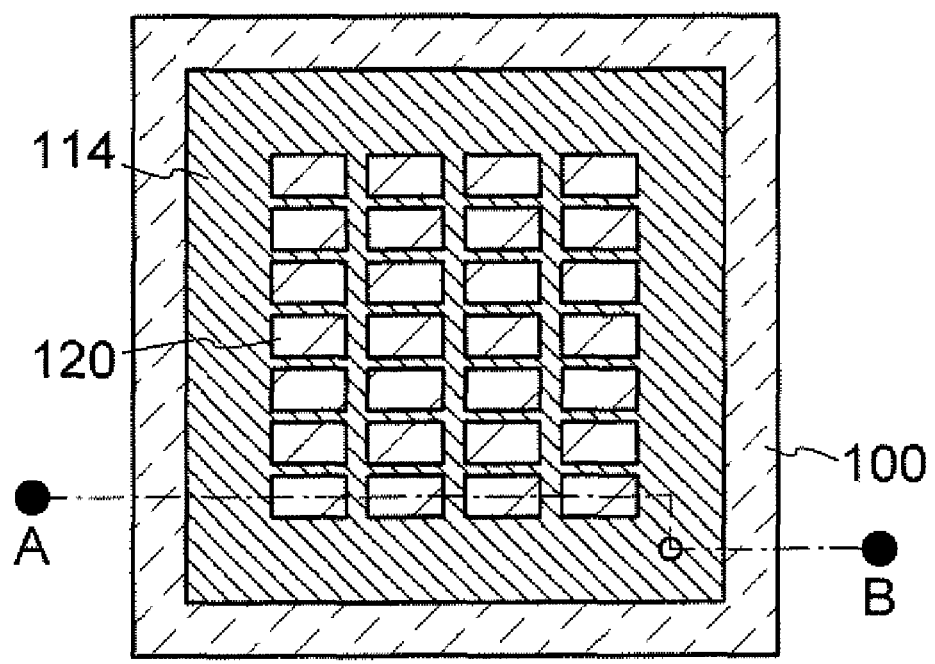

After the above steps, the single crystal semiconductor layer 118 of the SOI substrate may be patterned into an island-shaped semiconductor layer 120. In the patterning, it is desirable that the single crystal semiconductor layer 118 in the region corresponding to the periphery (the vicinity of the recessed portion 140) be removed (see FIG. 2C and FIG. 3B). FIG. 2C corresponds to a cross section along line A-B in FIG. 3B. Here, the single crystal semiconductor layer 118 in the region corresponding to the periphery is removed because a region which cannot be used for a semiconductor device is caused by formation of the closed space 141 and because the possibility increases that peeling of the semiconductor layer occurs due to the shortage of the bonding strength. Note that the shortage of the bonding strength is caused because the edge of the surface of the single crystal semiconductor substrate has a curved surface-shape (called Edge Roll-Off) resulting from surface polishing treatment.

Although the recessed portion is provided in one portion at a corner of the single crystal semiconductor layer in this embodiment (see FIG. 3A or the like), one embodiment of the disclosed invention is not limited thereto. The number, the position, and the like of the recessed portions 140 can be set as appropriate. Note that in consideration of improvement in the manufacturing yield of semiconductor devices in a later step, it is desirable that the recessed portion 140 be formed in the region to be removed in a later step (see FIG. 3B); however, one embodiment of the disclosed invention should not be construed as being limited to this structure.

Next, another example of a method for manufacturing an SOI substrate will be described with reference to FIGS. 4A to 4G.

Figure 4A:
FIGS. 4A to 4G are cross-sectional views illustrating an example of a method for manufacturing an SOI substrate.
Figure 4B:
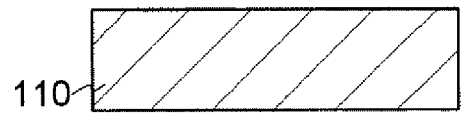

First, the base substrate 100 and the single crystal semiconductor substrate 110 are prepared (see FIGS. 4A and 4B).

Figure 4C:
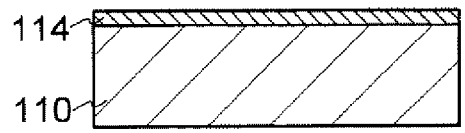

Next, the insulating layer 114 is formed over the single crystal semiconductor substrate 110 (see FIG. 4C).

Figure 4D:

Next, the recessed portion 140 is formed in a region which corresponds to the periphery of the single crystal semiconductor substrate 110 serving as a bond substrate (see FIG. 4D). As a method for forming the recessed portion 140, a mask is formed over the single crystal semiconductor substrate 110 and the single crystal semiconductor substrate 110 is selectively removed. A resist mask may be used as the mask which is formed over the single crystal semiconductor substrate 110. As a method for forming the recessed portion, for example, a dry etching method, or a combination of a wet etching method and a dry etching method, a laser processing method, an ultrasonic processing method, a drill processing method, a microblast processing method, or the like may be used. The depth of the recessed portion 140 is greater than or equal to $\frac{1}{100}$, preferably greater than or equal to $\frac{1}{10}$, more preferably greater than or equal to $\frac{1}{2}$, of the thickness of the semiconductor substrate. The recessed portion 140 may penetrate the single crystal semiconductor substrate 110.

Figure 4E:
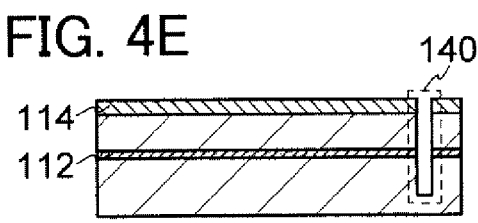

Next, the embrittled region 112 is formed at a predetermined depth from the surface of the single crystal semiconductor substrate 110 (see FIG. 4E).

Figure 4F:
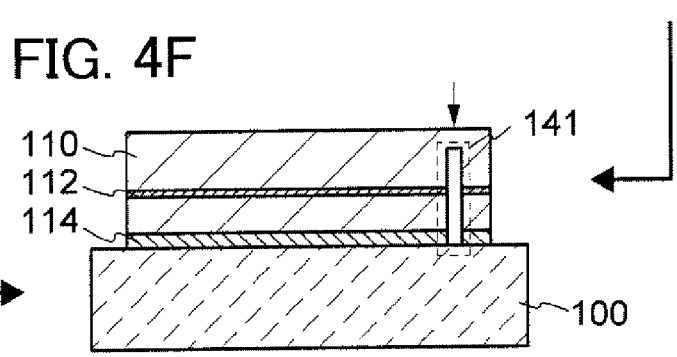
Figure 4G:
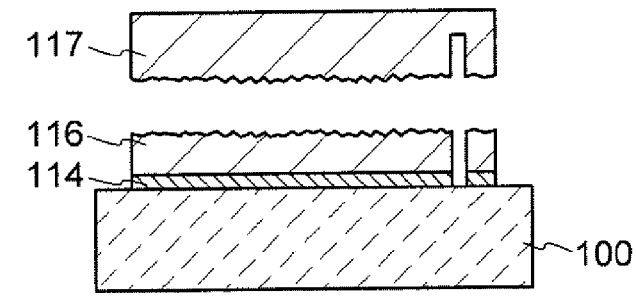

Detailed description of steps in FIGS. 4F and 4G is omitted because the steps in FIGS. 1F and 1G can be referred to.

As for steps after the step in FIG. 4G, the steps in FIGS. 2A to 2C and FIGS. 3A and 3B can be applied. An SOI substrate can be manufactured by performing the steps in FIGS. 2A to 2C and FIGS. 3A and 3B after the step in FIG. 4G.

Further, the single crystal semiconductor substrate 117 illustrated in FIG. 4G can be reused as the single crystal semiconductor substrate 110 provided with the recessed portion 140 illustrated in FIG. 1C, by performing reprocessing treatment. The depth of the recessed portion is greater than or equal to $\frac{1}{100}$, preferably greater than or equal to $\frac{1}{10}$, more preferably greater than or equal to $\frac{1}{2}$, of the thickness of the semiconductor substrate, or the recessed portion penetrates the single crystal semiconductor substrate 110. Thus, the recessed portion 140 needs to be formed only once or once every plural times each for manufacturing an SOI substrate, whereby the single crystal semiconductor substrate 110 (or other semiconductor substrates) can be manufactured with high productivity.

The structure described in this embodiment can be used in appropriate combination with the structures described in other embodiments.

Embodiment 2

In this embodiment, the case where reprocessing treatment is performed on the single crystal semiconductor substrate 117 illustrated in FIG. 1G or FIG. 4G will be described with reference to FIGS. 7A to 7C.

Figure 7A:
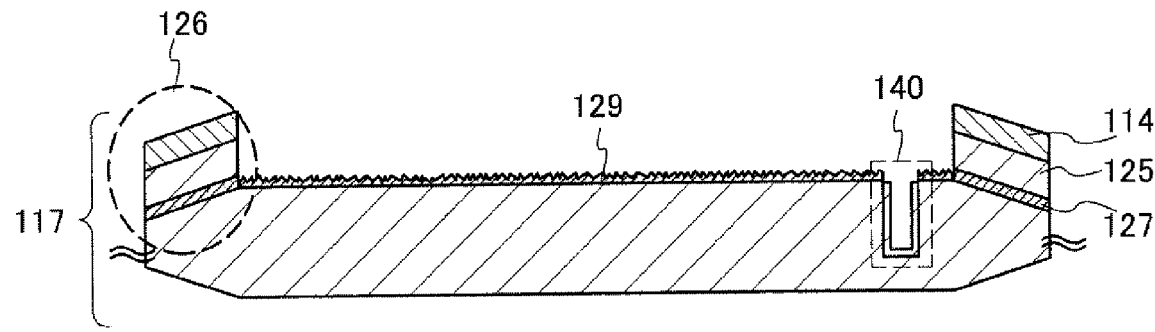
FIGS. 7A to 7C are cross-sectional views illustrating an example of a method of reprocessing treatment for an SOI substrate.

As illustrated in FIG. 7A, a projected portion 126 is formed in the periphery of the single crystal semiconductor substrate 117 after the step in FIG. 1G or FIG. 4G. The projected portion 126 includes a remaining embrittled region 127, a remaining single crystal semiconductor layer 125, and the remaining insulating layer 114, without being bonded to the base substrate 100. In addition, the single crystal semiconductor substrate 117 includes a remaining embrittled region 129.

The reprocessing treatment of the semiconductor substrate includes at least two etching treatments: an etching treatment for removing the insulating layer 114 (hereinafter, referred to as a first etching treatment) and an etching treatment for removing the remaining single crystal semiconductor layer 125 and the remaining embrittled regions 127 and 129 (hereinafter, referred to as a second etching treatment). These are described in detail below.

First, the first etching treatment is described with reference to FIG. 7A. As described above, the first etching treatment is etching treatment for removing the insulating layer 114 from the single crystal semiconductor substrate 117. Here, the insulating layer 114 can be removed by a wet etching treatment using a solution containing hydrofluoric acid as an etchant. As the solution containing hydrofluoric acid, a mixed solution containing hydrofluoric acid, ammonium fluoride, and a surfactant (e.g., product name: LAL 500, produced by Stella Chemifa Corporation) or the like is preferably used. This wet etching treatment is preferably performed for 30 seconds to 1200 seconds, for example, approximately 600 seconds.

Since wet etching treatment can be performed in such a manner that the single crystal semiconductor substrate 117 is soaked in a solution in a treatment tank, a plurality of single crystal semiconductor substrates 117 can be processed at one time. Accordingly, efficiency of the reprocessing treatment can be increased. Further, since the insulating layer 114 is removed by the first etching treatment and does not need to be removed by the second etching treatment, the etching time can be shortened. Moreover, since a semiconductor is hardly etched in the first etching treatment, the amount of the single crystal semiconductor substrate 117 removed by the etching can be reduced and the number of times of reprocessing can be increased.

In the first etching treatment, at least the insulating layer 114 needs to be removed, and dry etching treatment may be employed. Alternatively, wet etching treatment and dry etching treatment may be used in combination. For the dry etching treatment, a parallel plate reactive ion etching (RIE) method, an inductively coupled plasma (ICP) etching method, or the like can be used. By the first etching treatment, the projected portion 126 including the single crystal semiconductor layer 125 and the embrittled region 127, and the embrittled region 129 are left in the periphery of the single crystal semiconductor substrate 117.

Next, the second etching treatment is described with reference to FIG. 7B. In the second etching treatment, the single crystal semiconductor layer 125 and the embrittled regions 127 and 129 (the single crystal semiconductor layer 125 and the embrittled regions 127 and 129 are collectively referred to as a damaged semiconductor region) which are included in the projected portion 126 in FIG. 7B are selectively removed. More specifically, wet etching treatment is performed using, as an etchant, a mixed solution which includes a substance that oxidizes a semiconductor material, a substance that dissolves the oxidized semiconductor material, and a substance that controls the speed of oxidation of the semiconductor material and the speed of dissolution of the oxidized semiconductor material. The second etching treatment is preferably performed for approximately 1 minute to 30 minutes, for example, approximately 2 minutes to 4 minutes. In addition, the temperature of the mixed solution is preferably set at approximately 10° C. to 30° C., for example, 25° C.

In the above treatment, nitric acid is preferably used for a chemical solution including the substance that oxidizes the semiconductor material. Hydrofluoric acid is preferably used for a chemical solution including the substance that dissolves the oxidized semiconductor material. Acetic acid is preferably used for a chemical solution including the substance that controls the speed of oxidation of the semiconductor material and the speed of dissolution of the oxidized semiconductor material. In the case where a mixed solution of nitric acid (concentration of 70 weight %), hydrofluoric acid (concentration of 50 weight %), and acetic acid (concentration of 97.7 weight %) is used as an etchant, it is preferable that the volume of nitric acid be more than 0.01 times and less than one time as large as that of acetic acid and be more than 0.1 times and less than 100 times as large as that of hydrofluoric acid, and the volume of hydrofluoric acid be more than 0.01 times and less than 0.5 times as large as that of acetic acid. For example, it is preferable that the volume ratio of hydrofluoric acid, nitric acid, and acetic acid be 1:3:10, 1:2:10, 1.5:3:10, or the like. Note that the volume ratio 1:3:10 is expressed as $HF:HNO_3:CH_3COOH:H_2O=2.1:3.3:11.6:7.4$ in a molar ratio of molecules. There is no particular limitation on the composition of the other molecules.

In the above expressions using a ratio, the chemical solutions or the molar numbers each have a margin of error of ±10%. For example, in the expression that the volume ratio of hydrofluoric acid, nitric acid, and acetic acid is 1:3:10, x:y:z (hydrofluoric acid (x), nitric acid (y), and acetic acid (z)) may be in a range of x=0.9 to 1.1, y=2.7 to 3.3, and z=9 to 11. Similarly, in the expression that the volume ratio of hydrofluoric acid, nitric acid, and acetic acid is 1:2:10, x:y:z (hydrofluoric acid (x), nitric acid (y), and acetic acid (z)) may be in a range of x=0.9 to 1.1, y=1.8 to 2.2, and z=9 to 11.

In the damaged semiconductor region, there are crystal defects, voids, and the like due to the introduction of ions and the like, so that the etchant penetrates easily into the damaged semiconductor region. Accordingly, in the damaged semiconductor region, wet etching treatment proceeds not only from a surface but also from the inside. Specifically, the etching tends to proceed in such a manner that a deep hole is formed in a direction perpendicular to the plane surface of the substrate and then the hole is expanded. In other words, in the damaged semiconductor region, etching treatment proceeds at a higher etching rate than in a less-damaged semiconductor region or the non-damaged semiconductor region. Here, "etching rate" means the etching amount (amount etched) per unit time. That is, "a film whose etching rate is high" represents a film which is easily etched, and "a film whose etching rate is low" represents a film which is difficult to be etched. In addition, "to obtain etching selectivity" means that, for example, a layer A and a layer B are etched under the condition where there is a sufficient difference between the etching rate of the layer A and the etching rate of the layer B. Moreover, the less-damaged semiconductor region means a semiconductor region in which the degree of damage is relatively low compared to that of the unseparated single crystal semiconductor layer 125, the embrittled region 127, the embrittled region 129, and the like.

More specifically, the etching rate of the damaged semiconductor region is twice or more as high as that of the non-damaged semiconductor region (or the less-damaged semiconductor region). That is, the etching selectivity of the damaged semiconductor region to the non-damaged semiconductor region (or the less-damaged semiconductor region) is 2 or higher.

In this manner, when the wet etching treatment is performed using, as an etchant, the mixed solution which includes the substance that oxidizes the semiconductor material, the substance that dissolves the oxidized semiconductor material, and the substance that controls the speed of oxidation of the semiconductor material and the speed of dissolution of the oxidized semiconductor material, the damaged semiconductor region can be selectively removed. Accordingly, the amount of the semiconductor removed in the reprocessing treatment can be reduced, and the number of times of reprocessing and use can be increased. Further, by the wet etching treatment, a plurality of single crystal semiconductor substrates 117 can be processed at once; therefore, efficiency of the reprocessing treatment can be increased. Furthermore, since the second etching treatment can be performed in a short time, efficiency of the reprocessing treatment can be increased also for this reason.

Note that the thickness of the damaged semiconductor region in the projected portion 126 (the single crystal semiconductor layer 125 and the embrittled region 127) is greatly different from the thickness of the damaged semiconductor region in the other region (the embrittled region 129). Therefore, the etching selectivity of the projected portion 126 (the periphery) to the other region (the central portion) is not constant during the second etching treatment.

Specifics are described below. Immediately after the second etching treatment is started, the damaged semiconductor region is first etched both in the projected portion 126 and in the other region; thus, the etching selectivity is approximately 1. After the damaged semiconductor region in the region other than the projected portion 126 (the embrittled region 129) is etched to be removed, the less-damaged semiconductor region or the non-damaged semiconductor region is exposed in the region other than the projected portion 126; thus, the damaged semiconductor region in the projected portion 126 is preferentially removed, and the etching selectivity becomes 2 or higher. After the damaged semiconductor region in the projected portion 126 (the single crystal semiconductor layer 125 and the embrittled region 127) is etched to be removed, the less-damaged semiconductor region or the non-damaged semiconductor region is exposed also in the projected portion 126; thus, the etching selectivity returns to approximately 1.

In this manner, since the etching selectivity varies during the second etching treatment, the etching can be finished in consideration of this. For example, by stopping the etching treatment at the stage where the etching selectivity is reduced to lower than 2, the damaged semiconductor region can be removed while the amount of the semiconductor removed by the second etching treatment is reduced. In this case, the reprocessing treatment can be surely performed and a sufficient number of times of reprocessing can be secured. Note that the etching selectivity may be a value (a difference value) obtained by comparing the amounts of reduced thickness in a predetermined time (e.g., 30 seconds or 1 minute) or a value (a differential value) obtained by comparing the amounts of reduced thickness in an instant.

Figure 7B:
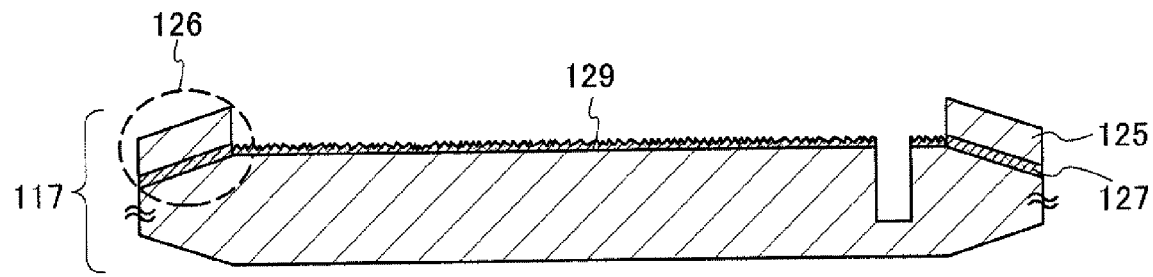
Figure 7C:
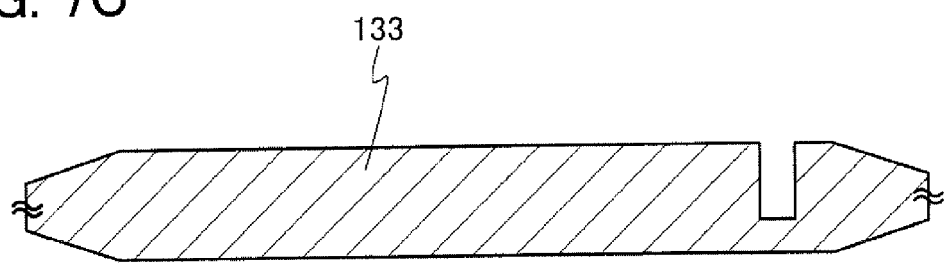

After the remaining single crystal semiconductor layer 125 and the remaining embrittled regions 127 and 129 which are illustrated in FIG. 7B are removed by the etching treatment performed on the single crystal semiconductor substrate 117, the surface of the single crystal semiconductor substrate 117 is polished, so that a single crystal semiconductor substrate 133 having a smooth surface is formed as illustrated in FIG. 7C. The single crystal semiconductor substrate 133 can be reused as the single crystal semiconductor substrate 110 illustrated in FIG. 1C.

As polishing treatment, chemical mechanical polishing (abbr. CMP) can be used. To smooth a surface of the single crystal semiconductor substrate 133, the surface is desirably polished by approximately 1 µm to 10 µm in thickness. After polishing, since polishing particles and the like remain on the surface of the single crystal semiconductor substrate 133, cleaning with hydrofluoric acid or RCA cleaning is performed. Note that RCA cleaning refers to a cleaning method for a semiconductor substrate, which is developed by Radio Corporation of America, in which chemical in which hydrogen peroxide as a base is added with alkali or acid is used at high temperature.

By reusing the single crystal semiconductor substrate 133, the material cost of the SOI substrate can be reduced.

Note that the structure described in this embodiment can be combined with any of the structures described in other embodiments as appropriate.

Embodiment 3

In this embodiment, another example of a method for manufacturing an SOI substrate will be described with reference to drawings.

Figure 8A:
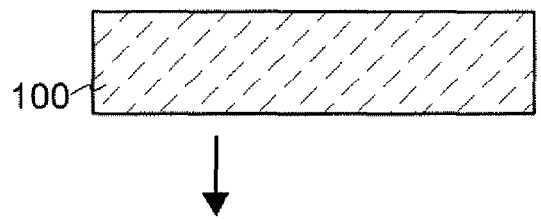
FIGS. 8A to 8H are cross-sectional views illustrating an example of a method for manufacturing an SOI substrate.
Figure 8C:
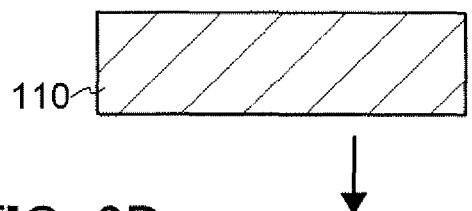

First, the base substrate 100 and the single crystal semiconductor substrate 110 as a bond substrate are prepared (see FIGS. 8A and 8C).

Figure 8B:
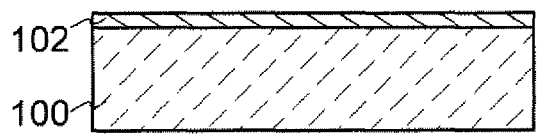

Next, a nitrogen-containing layer 102 (for example, a layer including an insulating film containing nitrogen, such as a silicon nitride ($SiN_x$) film or a silicon nitride oxide ($SiN_xO_y$ (x>y)) film) is formed over the surface of the base substrate 100 (see FIG. 8B).

The nitrogen-containing layer 102 formed in this embodiment functions as a layer (a bonding layer) for bonding a single crystal semiconductor layer in a later step. The nitrogen-containing layer 102 also functions as a barrier layer for preventing an impurity contained in the base substrate, such as sodium (Na), from diffusing into the single crystal semiconductor layer.

As mentioned above, the nitrogen-containing layer 102 is used as a bonding layer in this embodiment; thus, the nitrogen-containing layer 102 is preferably formed such that its surface has a predetermined degree of flatness. Specifically, the nitrogen-containing layer 102 is formed such that it has an average surface roughness ($R_a$) of 0.5 nm or less and a root-mean-square surface roughness ($R_{ms}$) of 0.60 nm or less, preferably, an average surface roughness of 0.35 nm or less and a root-mean-square surface roughness of 0.45 nm or less. The thickness is in the range of greater than or equal to 10 nm and less than or equal to 200 nm, more preferably, greater than or equal to 50 nm and less than or equal to 100 nm. With the surface flatness improved as described above, the bonding defect of the single crystal semiconductor layer can be prevented.

Figure 8D:
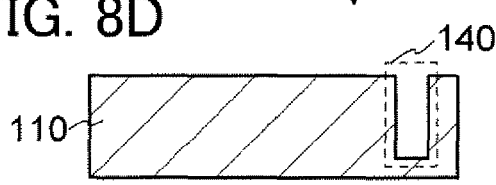

Next, a recessed portion 140 is formed in a region corresponding to the periphery of the single crystal semiconductor substrate 110 serving as a bond substrate (see FIG. 8D). As a method for forming the recessed portion 140, a mask is formed over the single crystal semiconductor substrate 110 and the single crystal semiconductor substrate 110 is selectively removed. A resist mask may be used as the mask which is formed over the single crystal semiconductor substrate 110. As a method for forming the recessed portion, for example, a wet etching method, a dry etching method, or a combination of a wet etching method and a dry etching method, a laser processing method, an ultrasonic processing method, a drill processing method, a microblast processing method, or the like may be used. The depth of the recessed portion 140 is greater than or equal to 1/100, preferably greater than or equal to 1/10, more preferably greater than or equal to 1/2, of the thickness of the single crystal semiconductor substrate 110. The recessed portion 140 may penetrate the single crystal semiconductor substrate 110.

Figure 8E:
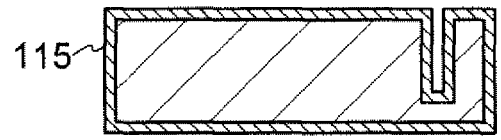

Next, an insulating layer 115 is formed over the single crystal semiconductor substrate 110 (see FIG. 8E). The insulating layer 115 is formed along the recessed portion 140 in the single crystal semiconductor substrate 110. The insulating layer 115 is not necessarily formed over a side surface and a bottom surface of the recessed portion 140. In view of removal of contaminants, it is preferable that the surface of the single crystal substrate 110 be cleaned in advance with a sulfuric acid/hydrogen peroxide mixture (SPM), an ammonium hydrogen peroxide mixture (APM), a hydrochloric acid/hydrogen peroxide mixture (HPM), diluted hydrofluoric acid (DHF), or the like before formation of the insulating layer 115. Dilute hydrofluoric acid and ozone water may be discharged alternately for cleaning.

The insulating layer 115 can be formed with a single layer of a silicon oxide film, a silicon oxynitride film, or the like, or a stacked layer of these films. A thermal oxidation method, a CVD method, a sputtering method, or the like can be employed to manufacture the insulating layer 115. When the insulating layer 115 is formed by a CVD method, a silicon oxide film is preferably formed using organosilane such as tetraethoxysilane (abbreviation: TEOS, chemical formula: $Si(OC_2H_5)_4$).

In this embodiment, the insulating layer 115 (here, an $SiO_x$ film) is formed by performing thermal oxidation treatment on the single crystal semiconductor substrate 110. The thermal oxidation treatment is preferably performed in an oxidizing atmosphere to which a halogen is added.

For example, the single crystal semiconductor substrate 110 is subjected to the thermal oxidation treatment in an oxidizing atmosphere to which chlorine (Cl) is added, whereby the insulating layer 115 is formed through chlorine oxidation. In this case, the insulating layer 115 contains chlorine atoms.

The chlorine atoms contained in the insulating layer 115 form distortion in the insulating layer 115. As a result, moisture absorption rate of the insulating layer 115 is improved and diffusion rate of moisture is increased. That is, when moisture exists at a surface of the insulating layer 115, the moisture existing at the surface of the insulating layer 115 can be quickly absorbed and diffused into the insulating layer 115, so that the bonding defect due to moisture can be reduced.

Further, with the chlorine atoms contained in the insulating layer 115, heavy metal (such as Fe, Cr, Ni, or Mo) that is an extrinsic impurity can be captured, so that contamination of the single crystal semiconductor substrate 110 can be prevented. Moreover, after the bonding to the base substrate, impurities from the base substrate, such as Na, can be fixed, so that contamination of the single crystal semiconductor substrate 110 can be prevented.

Note that the halogen atoms contained in the insulating layer 115 are not limited to chlorine atoms. The insulating layer 115 may include fluorine atoms. As a method for fluorine oxidation of the surface of the single crystal semiconductor substrate 110, a method in which the single crystal semiconductor substrate 110 is soaked in an HF solution and then subjected to thermal oxidation treatment in an oxidizing atmosphere, a method in which thermal oxidation treatment is performed in an oxidizing atmosphere to which $NF_3$ is added, or the like can be used.

Figure 8F:
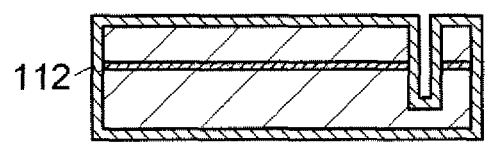

Next, the single crystal semiconductor substrate 110 is irradiated with ions accelerated by an electrical field, whereby the embrittled region 112, where the crystal structure is damaged, is formed in the single crystal semiconductor substrate 110 at a predetermined depth (see FIG. 8F). The aforementioned embodiment can be referred to for details. Note that heavy metal may also be added when the embrittled region 112 is formed using the ion-doping apparatus; however, the ion irradiation is performed through the insulating layer 115 containing halogen atoms, whereby contamination of the single crystal semiconductor substrate 110 due to the heavy metal can be prevented.

Figure 8G:
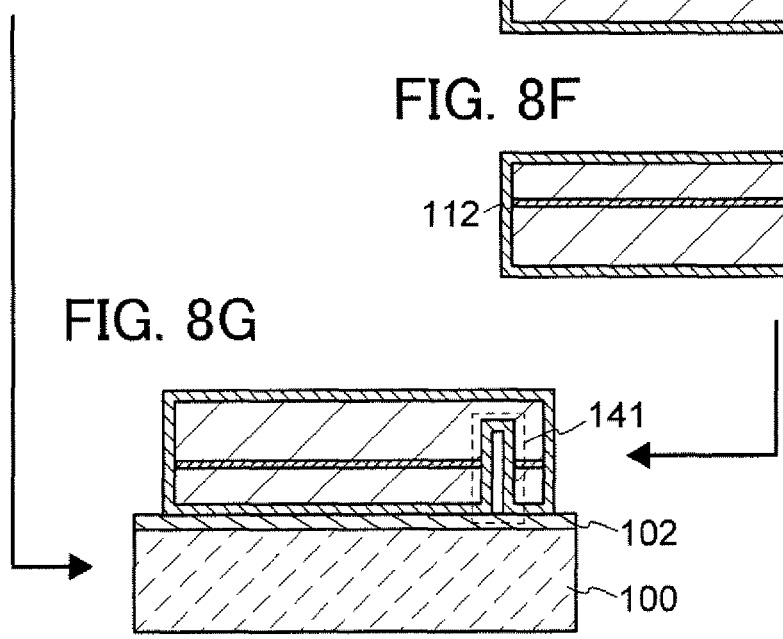

Next, the base substrate 100 and the single crystal semiconductor substrate 110 are bonded to each other with the insulating layer 115 interposed therebetween (see FIG. 8G). By bonding the base substrate 100 and the single crystal semiconductor substrate 110 to each other with the insulating layer 115 interposed therebetween, a space 141 surrounded by the groove portion in the single crystal semiconductor substrate 110 and the base substrate 100 is formed.

Figure 8H:
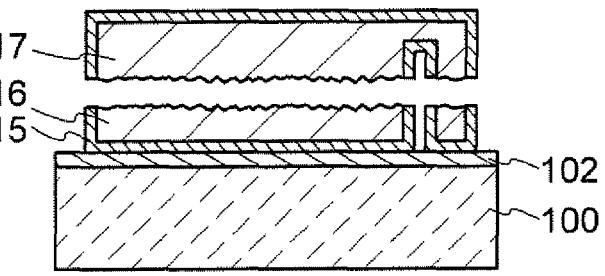

Next, the single crystal semiconductor substrate 110 is separated at the embrittled region 112 by performing the heat treatment, so that the single crystal semiconductor layer 116 is formed over the base substrate 100 with the nitrogen-containing layer 102 and the insulating layer 115 interposed therebetween (see FIG. 8H).

Figure 10A:
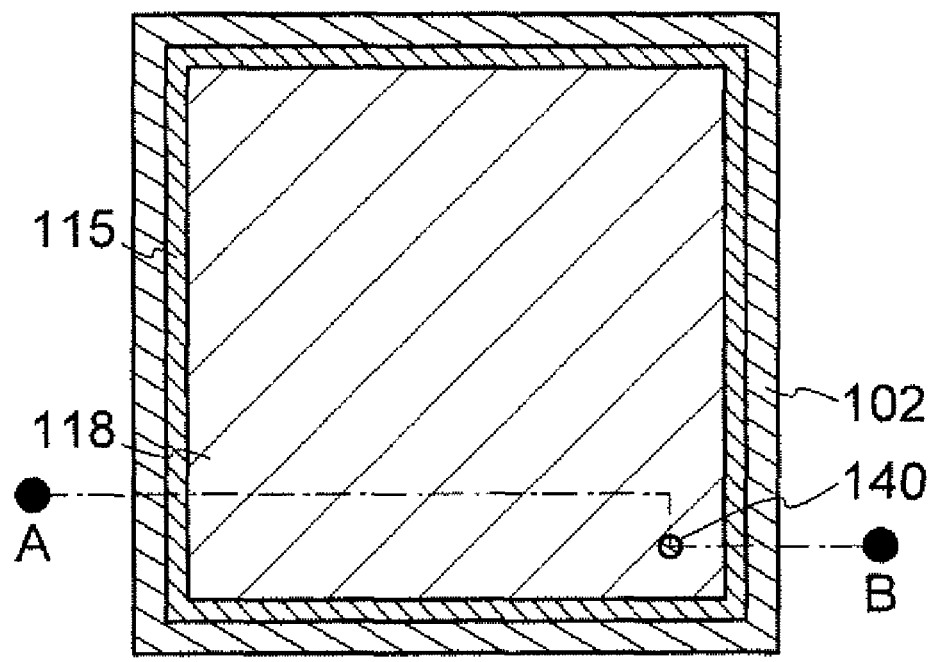
FIGS. 10A and 10B are plan views illustrating an example of a method for manufacturing an SOI substrate.

Next, a surface of the single crystal semiconductor layer 116 is irradiated with the laser light 132, whereby a single crystal semiconductor layer 118 in which the flatness of the surface is improved and the number of defects is reduced is formed (see FIGS. 9B and 9C and FIG. 10A). FIG. 9C corresponds to a cross section taken along line A-B in FIG. 10A.

Although the irradiation treatment with the laser light 132 is performed just after the heat treatment for separation of the single crystal semiconductor layer 116 in this embodiment, one embodiment of the disclosed invention is not construed as being limited to this. Etching treatment may be performed after the heat treatment for separation of the single crystal semiconductor layer 116, to remove a region including many defects in the surface of the single crystal semiconductor layer 116, and then the irradiation treatment with the laser light 132 may be performed. Alternatively, after the flatness of the surface of the single crystal semiconductor layer 116 is improved, the irradiation treatment with the laser light 132 may be performed. Note that the etching treatment may be either wet etching or dry etching.

Although not described in this embodiment, after the irradiation with the laser light 132 is performed as described above, a step of thinning the single crystal semiconductor layer 118 may be performed. In order to thin the single crystal semiconductor layer 118, one of dry etching and wet etching or a combination of both of the etchings may be employed.

Through the above steps, an SOI substrate having an excellent semiconductor layer where the surface roughness is reduced can be obtained (see FIG. 9C and FIG. 10A).

Figure 10B:
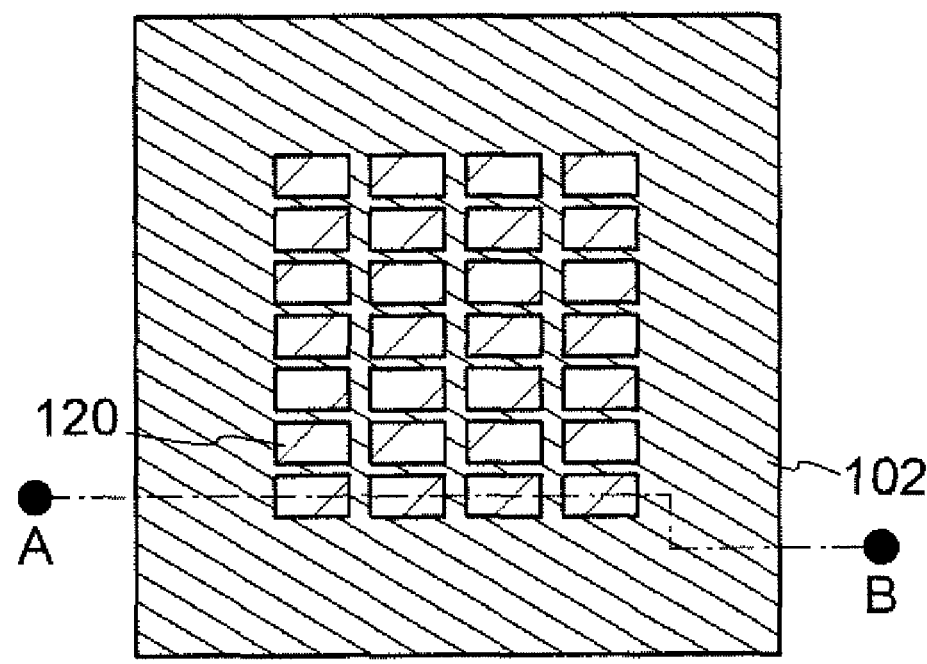

After the above steps, the single crystal semiconductor layer 118 of the SOI substrate may be patterned into an island-shaped semiconductor layer 120. In the patterning, it is desirable that the single crystal semiconductor layer 118 in the region corresponding to the periphery (the vicinity of the recessed portion 140 (or the projected portion)) be removed (see FIG. 9D and FIG. 10B). Note that FIG. 9D corresponds to a cross section taken along line A-B in FIG. 10B. Here, the single crystal semiconductor layer 118 in the region corresponding to the periphery is removed because a region which cannot be used for a semiconductor device is caused by formation of the groove portion and because the possibility increases that peeling of the semiconductor layer occurs due to the shortage of the bonding strength.

Note that although the recessed portion is formed in one portion at a corner of the single crystal semiconductor layer in this embodiment (see FIG. 10A or the like), one embodiment of the disclosed invention is not limited to this structure. The number, the position, and the like of the recessed portions may be determined as appropriate. Note that in consideration of improvement in the manufacturing yield of semiconductor devices in a later step, it is desirable that the recessed portion be formed in the region to be removed in a later step (see FIG. 10B); however, one embodiment of the disclosed invention should not be construed as being limited to this structure.

Next, another example of a method for manufacturing an SOI substrate is described with reference to FIGS. 11A to 11H.

First, the base substrate 100 and the single crystal semiconductor substrate 110 are prepared (see FIGS. 11A and 11C).

Then, a nitrogen-containing layer 102 (for example, a layer including an insulating film containing nitrogen, such as a silicon nitride ($SiN_x$) film or a silicon nitride oxide ($SiN_xO_y$, (x>y)) film) is formed over the base substrate 100 (see FIG. 11B).

Next, the insulating layer 115 is formed over the single crystal semiconductor substrate 110 (see FIG. 11D).

Next, a recessed portion 140 is formed in a region corresponding to the periphery of the single crystal semiconductor substrate 110 serving as a bond substrate (see FIG. 11E). As a method for forming the recessed portion 140, a mask is formed over the single crystal semiconductor substrate 110 and the single crystal semiconductor substrate 110 is selectively removed. A resist mask may be used as the mask which is formed over the single crystal semiconductor substrate 110. As a method for forming the recessed portion, for example, a wet etching method, a dry etching method, or a combination of a wet etching method and a dry etching method, a laser processing method, an ultrasonic processing method, a drill processing method, a microblast processing method, or the like may be used. The depth of the recessed portion is greater than or equal to $1/100$, preferably greater than or equal to $1/10$, more preferably greater than or equal to $1/2$, of the thickness of the single crystal semiconductor substrate 110. The recessed portion may penetrate the single crystal semiconductor substrate 110.

Next, the embrittled region 112 is formed at a predetermined depth from the surface of the single crystal semiconductor substrate 110 (see FIG. 11F).

Detailed description of steps in FIGS. 11G and 11H is omitted because the steps in FIGS. 8G and 8H can be referred to.

As for steps after the step in FIG. 11H, the steps in FIGS. 9A to 9D and FIGS. 10A and 10B can be applied. An SOI substrate can be manufactured by performing the steps in FIGS. 9A to 9D and FIGS. 10A and 10B after the step in FIG. 11H.

The structure described in this embodiment can be used in appropriate combination with the structures described in other embodiments.

Embodiment 4

In this embodiment, details of the method for manufacturing the semiconductor device described in any of the above-described embodiments will be described with reference to FIGS. 12A to 12D, 13A to 13D, and 14A and 14B. Here, a method for manufacturing a semiconductor device including a plurality of transistors is described as an example of the semiconductor device. Various semiconductor devices can be formed with the use of a combination of transistors described below.

Figure 12A:
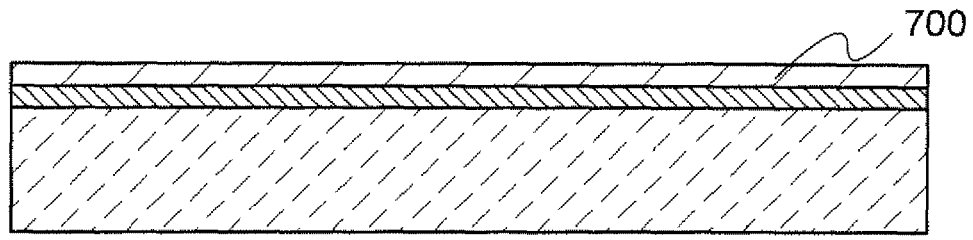
FIGS. 12A to 12D are cross-sectional views illustrating an example of a method for manufacturing a semiconductor device.

FIG. 12A is a cross-sectional view illustrating part of a semiconductor substrate which is manufactured employing the method described in Embodiment 1 or the like (for example, see FIG. 2B or the like). Note that although the case where a semiconductor device is manufactured using the semiconductor substrate formed in Embodiment 1 is described in this embodiment, it is needless to say that a semiconductor substrate formed in any of the other embodiments may be used.

In order to control threshold voltages of TFTs, a p-type impurity element such as boron, aluminum, or gallium or an n-type impurity element such as phosphorus or arsenic may be added to a semiconductor layer 700 (corresponding to the single crystal semiconductor layer 118 in FIG. 2B). A region to which the impurity element is added and the kind of the impurity element to be added can be changed as appropriate. For example, a p-type impurity element is added to a formation region of an n-channel TFT, and an n-type impurity element is added to a formation region of a p-channel TFT. The above impurity elements may be added at a dose of approximately higher than or equal to $1\times10^{15}/cm^2$ and lower than or equal to $1\times10^{17}/cm^2$.

Figure 12B:
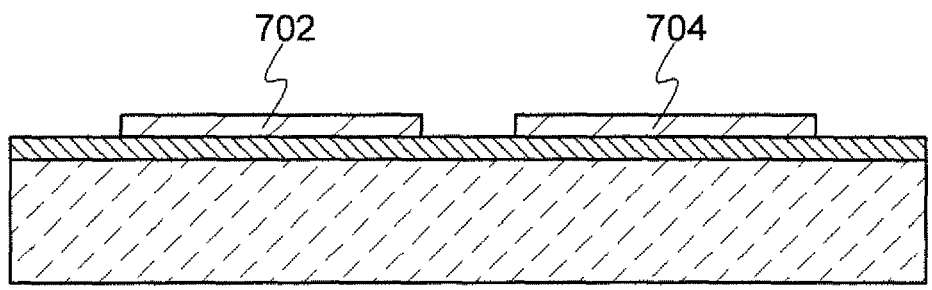

Then, the semiconductor layer 700 is divided into island shapes to form a semiconductor layer 702 and a semiconductor layer 704 (see FIG. 12B). Note that at that time, the single crystal semiconductor layer 118 is desirably removed in a region corresponding to the periphery (the vicinity of a region where bonding is not performed) (for example, see FIG. 2C or the like).

Figure 12C:
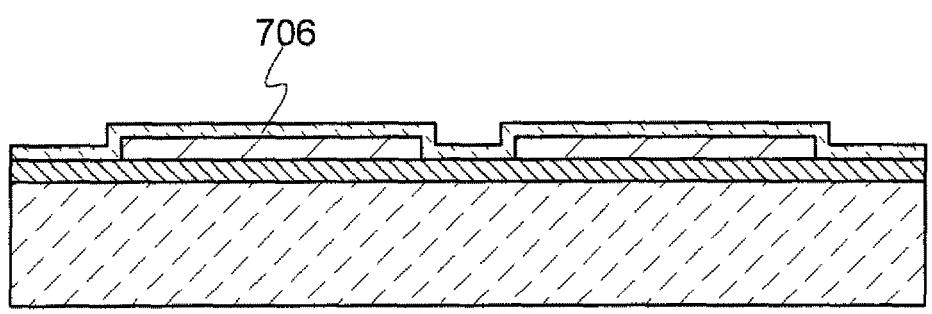

Next, a gate insulating film 706 is formed to cover the semiconductor layer 702 and the semiconductor layer 704 (see FIG. 12C). Here, a single-layer silicon oxide film is formed by a plasma CVD method. Alternatively, a film containing silicon oxynitride, silicon nitride oxide, silicon nitride, hafnium oxide, aluminum oxide, tantalum oxide, or the like may be formed to have a single-layer structure or a stacked-layer structure as the gate insulating film 706.

As a manufacturing method other than a plasma CVD method, a sputtering method or a method using oxidation or nitridation by high density plasma treatment can be given. High-density plasma treatment is performed using, for example, a mixed gas of a rare gas such as helium, argon, krypton, or xenon; and a gas such as oxygen, nitrogen oxide, ammonia, nitrogen, or hydrogen. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since the oxidation or nitridation of the semiconductor layers through the above high-density plasma treatment is a solid-phase reaction, the interface state density between the gate insulating film 706 and each of the semiconductor layers 702 and 704 can be drastically reduced. Further, the semiconductor layers are directly oxidized or nitrided by the high-density plasma treatment, whereby variation in the thickness of the insulating film to be formed can be suppressed. Since the semiconductor layers are single crystal films, even when the surfaces of the semiconductor layers are oxidized by a solid-phase reaction by using the high-density plasma treatment, a gate insulating film with high uniformity and low interface state density can be formed. When an insulating film formed by high-density plasma treatment as described above is used for a part or whole of the gate insulating film of a transistor, variation in characteristics can be suppressed.

Alternatively, the gate insulating film 706 may be formed by thermally oxidizing the semiconductor layer 702 and the semiconductor layer 704. In the case of such thermal oxidation, it is necessary to use a glass substrate having a certain degree of heat resistance.

Note that hydrogen contained in the gate insulating film 706 may be diffused into the semiconductor layer 702 and the semiconductor layer 704 by forming the gate insulating film 706 containing hydrogen and then performing heat treatment at a temperature higher than or equal to 350° C. and lower than or equal to 450° C. In this case, the gate insulating film 706 can be formed using silicon nitride or silicon nitride oxide by a plasma CVD method. Further, a process temperature is preferably set to be lower than or equal to 350° C. If hydrogen is supplied to the semiconductor layer 702 and the semiconductor layer 704 in this manner, defects in the semiconductor layer 702, in the semiconductor layer 704, at the interface between the gate insulating film 706 and the semiconductor layer 702, and at the interface between the gate insulating film 706 and the semiconductor layer 704 can be effectively reduced.

Figure 12D:
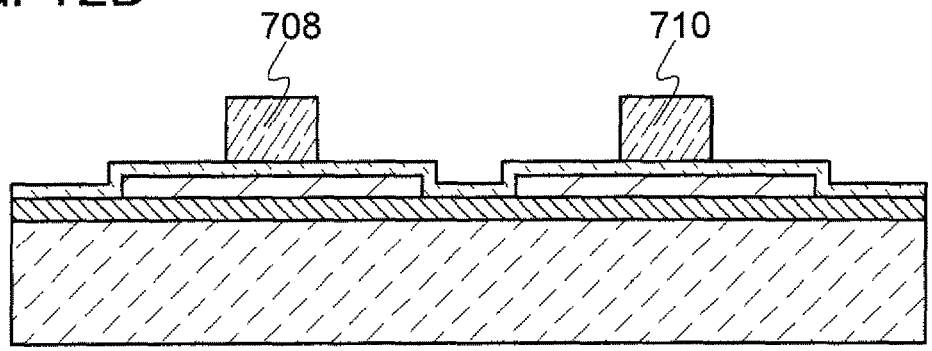

Next, a conductive film is formed over the gate insulating film 706, and then, the conductive film is processed (patterned) into a predetermined shape, whereby an electrode 708 and an electrode 710 are formed over the semiconductor layer 702 and the semiconductor layer 704, respectively (see FIG. 12D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). Alternatively, an alloy material containing the above-described metal as a main component or a compound containing the above-described metal can also be used. Further alternatively, a semiconductor material, such as polycrystalline silicon which is obtained by doping a semiconductor with an impurity element that imparts a conductivity type, may be used.

Although the electrodes 708 and 710 are formed using a single-layer conductive film in this embodiment, the semiconductor device according to one embodiment of the disclosed invention is not limited to this structure. Each of the electrodes 708 and 710 may be formed by stacking a plurality of conductive films. In the case of a two-layer structure, for example, a molybdenum film, a titanium film, a titanium nitride film, or the like may be used as a lower layer, and an aluminum film or the like may be used as an upper layer. In the case of a three-layer structure, a stacked structure of a molybdenum film, an aluminum film, and a molybdenum film; a stacked-layer structure of a titanium film, an aluminum film, and a titanium film; or the like may be used.

Note that a mask used for forming the electrodes 708 and 710 may be formed using a material such as silicon oxide or silicon nitride oxide. In this case, a step of forming a mask by patterning a silicon oxide film, a silicon nitride oxide film, or the like is additionally needed; however, decrease in film thickness of the mask in etching is smaller than that in the case of using a resist material; thus, the electrodes 708 and 710 with more precise shapes can be formed. Alternatively, the electrodes 708 and 710 may be selectively formed by a droplet discharge method without using a mask. Here, a droplet discharge method refers to a method in which droplets containing a predetermined composition are discharged or ejected to form a predetermined pattern, and includes an ink-jet method and the like in its category.

Alternatively, the electrodes 708 and 710 can be formed by etching the conductive film to have desired tapered shapes by an inductively coupled plasma (ICP) etching method with appropriate adjustment of etching conditions (e.g., the amount of electric power applied to a coiled electrode, the amount of electric power applied to a substrate-side electrode, the temperature of the substrate-side electrode, and the like). The tapered shape can be adjusted with the shape of the mask. Note that as an etching gas, a chlorine-based gas such as chlorine, boron chloride, silicon chloride, or carbon tetrachloride, a fluorine-based gas such as carbon tetrafluoride, sulfur fluoride, or nitrogen fluoride, oxygen, or the like can be used as appropriate.

Figure 13A:
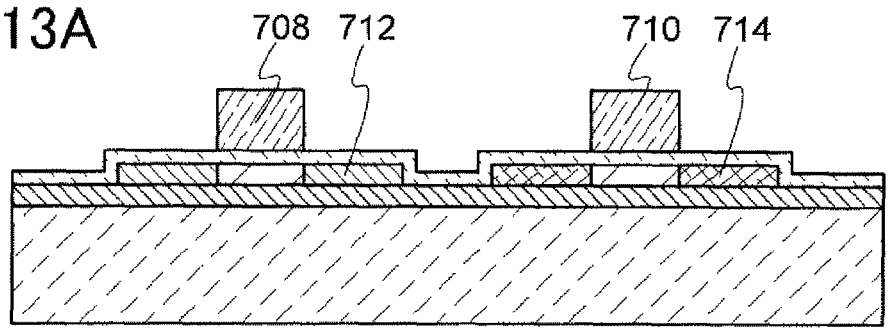
FIGS. 13A to 13D are cross-sectional views illustrating an example of a method for manufacturing a semiconductor device.

Next, an impurity element imparting one conductivity type is added to the semiconductor layer 702 and the semiconductor layer 704 by using the electrodes 708 and 710 as masks (see FIG. 13A). In this embodiment, an impurity element imparting n-type conductivity (for example, phosphorus or arsenic) is added to the semiconductor layer 702, and an impurity element imparting p-type conductivity (for example, boron) is added to the semiconductor layer 704. Note that when the impurity element imparting n-type conductivity is added to the semiconductor layer 702, the semiconductor layer 704 to which the impurity element imparting p-type conductivity is added is covered with a mask or the like so that the impurity element imparting n-type conductivity is added selectively. Further, when the impurity element imparting p-type conductivity is added to the semiconductor layer 704, the semiconductor layer 702 to which the impurity element imparting n-type conductivity is added is covered with a mask or the like so that the impurity element imparting p-type conductivity is added selectively. Alternatively, after one of the impurity element imparting p-type conductivity and the impurity element imparting n-type conductivity is added to the semiconductor layers 702 and 704, the other of the impurity element imparting p-type conductivity and the impurity element imparting n-type conductivity may be added to only one of the semiconductor layers at a higher concentration. By the addition of the impurity elements, impurity regions 712 and impurity regions 714 are formed in the semiconductor layer 702 and the semiconductor layer 704, respectively.

Figure 13B:
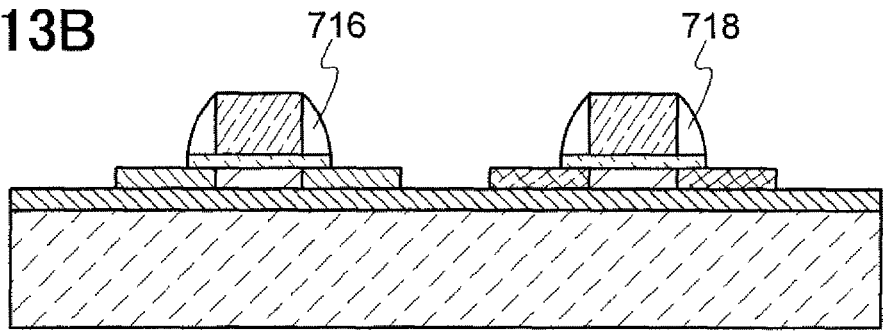

Next, sidewalls 716 are formed on side surfaces of the electrode 708, and sidewalls 718 are formed on side surfaces of the electrode 710 (see FIG. 13B). The sidewalls 716 and 718 can be formed by, for example, newly forming an insulating film so as to cover the gate insulating film 706 and the electrodes 708 and 710 and partly etching the newly formed insulating film by anisotropic etching. Note that the gate insulating film 706 may also be etched partially by the anisotropic etching described above. For the insulating film used for forming the sidewalls 716 and 718, a film containing silicon, silicon oxide, silicon nitride, silicon oxynitride, silicon nitride oxide, an organic material, or the like may be formed to have a single-layer structure or a stacked-layer structure by a plasma CVD method, a sputtering method, or the like. In this embodiment, a 100 nm thick silicon oxide film is formed by a plasma CVD method. In addition, as an etching gas, a mixed gas of $CHF_3$ and helium can be used. Note that the steps of forming the sidewalls 716 and 718 are not limited to the steps described here.

Figure 13C:
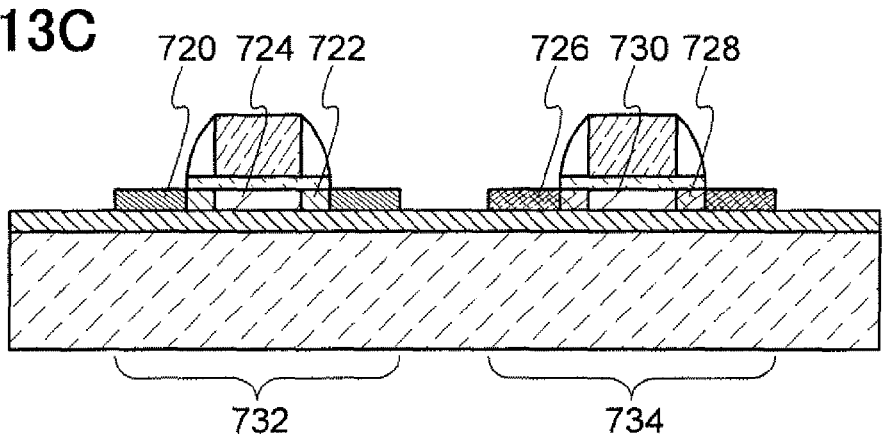

Next, impurity elements each imparting one conductivity type are added to the semiconductor layers 702 and 704 using the gate insulating film 706, the electrodes 708 and 710, and the sidewalls 716 and 718 as masks (see FIG. 13C). Note that the impurity elements imparting the same conductivity types as the impurity elements which have been added to the semiconductor layers 702 and 704 in the previous step are added to the semiconductor layers 702 and 704 at higher concentrations. Here, when the impurity element imparting n-type conductivity is added to the semiconductor layer 702, the semiconductor layer 704 to which the p-type impurity element is added is covered with a mask or the like so that the impurity element imparting n-type conductivity is added selectively. Further, when the impurity element imparting p-type conductivity is added to the semiconductor layer 704, the semiconductor layer 702 to which the n-type impurity element is added is covered with a mask or the like so that the impurity element imparting p-type conductivity is added selectively.

By the addition of the impurity element, a pair of high-concentration impurity regions 720, a pair of low-concentration impurity regions 722, and a channel formation region 724 are formed in the semiconductor layer 702. In addition, by the addition of the impurity element, a pair of high-concentration impurity regions 726, a pair of low-concentration impurity regions 728, and a channel formation region 730 are formed in the semiconductor layer 704. The high-concentration impurity regions 720 and the high-concentration impurity regions 726 each function as a source or a drain, and the low-concentration impurity regions 722 and the low-concentration impurity regions 728 each function as a lightly doped drain (LDD) region.

Note that the sidewalls 716 formed over the semiconductor layer 702 and the sidewalls 718 formed over the semiconductor layer 704 may be formed so as to have the same length or different lengths in a direction in which carriers move (in a direction parallel to a so-called channel length). For example, each of the sidewalls 718 over the semiconductor layer 704 which constitutes part of a p-channel transistor is preferably formed to have a longer length in the direction in which carriers move than that of each of the sidewalls 716 over the semiconductor layer 702 which constitutes part of an n-channel transistor. By increasing the lengths of the sidewalls 718 of the p-channel transistor, a short channel effect due to diffusion of boron can be suppressed; therefore, boron can be added to the source and the drain at high concentration. Accordingly, the resistance of the source and the drain can be reduced.

In order to further reduce the resistance of the source and the drain, a silicide region may be formed by forming silicide in part of the semiconductor layers 702 and 704. The silicide is formed by placing a metal in contact with the semiconductor layers and causing a reaction between the metal and silicon in the semiconductor layers by heat treatment (e.g., a GRTA method, an LRTA method, or the like). For the silicide region, cobalt silicide or nickel silicide may be used. In the case where the semiconductor layers 702 and 704 are thin, silicide reaction may be made to proceed to bottoms of the semiconductor layers 702 and 704. As a metal material used for the siliciding, the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide region can also be formed by laser light irradiation or the like.

Through the above steps, an n-channel transistor 732 and a p-channel transistor 734 are formed. Note that although conductive films each serving as a source electrode or a drain electrode have not been formed at the stage in FIG. 13C, a structure including these conductive films each serving as a source electrode or a drain electrode may also be referred to as a transistor.

Figure 13D:
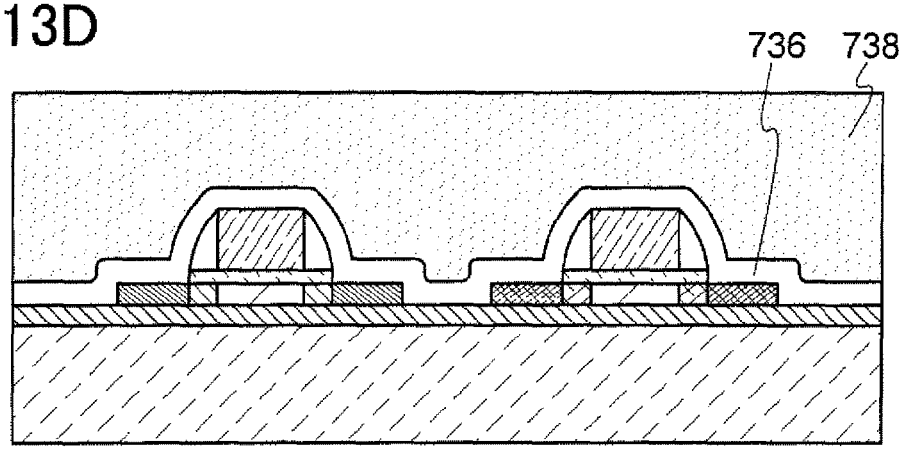

Next, an insulating film 736 is formed so as to cover the n-channel transistor 732 and the p-channel transistor 734 (see FIG. 13D). The insulating film 736 is not necessarily provided; however, the insulating film 736 can prevent impurities such as an alkali metal and an alkaline-earth metal from entering the n-channel transistor 732 and the p-channel transistor 734. Specifically, the insulating film 736 is preferably formed using a material such as silicon oxide, silicon nitride, silicon oxynitride, silicon nitride oxide, aluminum nitride, aluminum oxide, or the like. In this embodiment, a silicon nitride oxide film with a thickness of approximately 600 nm is used as the insulating film 736. In this case, the above-described hydrogenation step may be performed after the silicon nitride oxide film is formed. Note that although the insulating film 736 has a single-layer structure in this embodiment, it is needless to say that the insulating film 736 may have a stacked-layer structure. For example, in the case of a two-layer structure, the insulating film 736 may have a stacked structure of a silicon oxynitride film and a silicon nitride oxide film.

Next, an insulating film 738 is formed over the insulating film 736 so as to cover the n-channel transistor 732 and the p-channel transistor 734. The insulating film 738 may be formed using an organic material having heat resistance, such as polyimide, acrylic, benzocyclobutene, polyamide, or epoxy. Other than such an organic material, it is also possible to use a low-dielectric constant material (a low-k material), a siloxane based resin, silicon oxide, silicon nitride, silicon oxynitride, silicon nitride oxide, phosphosilicate glass (PSG), borophosphosilicate glass (BPSG), alumina, or the like. Here, the siloxane-based resin corresponds to a resin including a Si—O—Si bond which is formed using a siloxane-based material as a starting material. The siloxane-based resin may include, besides hydrogen, at least one of fluorine, an alkyl group, or aromatic hydrocarbon as a substituent. Note that the insulating film 738 may be formed by stacking a plurality of insulating films formed using any of the above materials.

For the formation of the insulating film 738, the following method can be used depending on the material of the insulating film 738: a CVD method, a sputtering method, an SOG method, a spin coating method, a dip coating method, a spray coating method, a droplet discharge method (e.g., an ink-jet method, screen printing, or offset printing), or a tool (equipment) such as a doctor knife, a roll coater, a curtain coater, or a knife coater.

Next, contact holes are formed in the insulating films 736 and 738 so that each of the semiconductor layers 702 and 704 is partly exposed. Then, conductive films 740 and 742 are formed in contact with the semiconductor layer 702 through the contact holes, and conductive films 744 and 746 are formed in contact with the semiconductor layer 704 through the contact holes (see FIG. 14A). The conductive films 740, 742, 744, and 746 serve as source electrodes and drain electrodes of the transistors. Note that in this embodiment, as an etching gas for forming the contact holes, a mixed gas of $CHF_3$ and He is employed; however, the etching gas is not limited thereto.

The conductive films 740, 742, 744, and 746 can be formed by a CVD method, a sputtering method, or the like. Specifically, as a material of the conductive films, aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like can be used. Moreover, an alloy containing the above-described material as its main component or a compound containing the above-described material may be used. Further, each of the conductive films 740, 742, 744, and 746 may have either a single-layer structure or a stacked-layer structure.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Aluminum and aluminum silicon (Al—Si), which have low resistance and are inexpensive, are suitable as a material for forming the conductive films 740, 742, 744, and 746. In particular, the aluminum silicon is preferable because a hillock can be prevented from generating due to resist baking at the time of patterning. Further, a material in which Cu is mixed into aluminum at approximately 0.5% may be used instead of silicon.

In the case where each of the conductive films 740, 742, 744, and 746 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming the conductive films such that an aluminum silicon film is interposed between barrier films, generation of hillocks of aluminum or aluminum silicon can be further prevented. Moreover, by forming the barrier film using titanium that is a highly reducible element, even if a thin oxide film is formed over the semiconductor layers 702 and 704, the oxide film is reduced by the titanium contained in the barrier film, whereby favorable contact can be obtained between the semiconductor layer 702 and the conductive films 740 and 742 and between the semiconductor layer 704 and the conductive films 744 and 746. Further, it is also possible to stack a plurality of barrier films. In that case, for example, each of the conductive films 740, 742, 744, and 746 can be formed to have a five-layer structure of titanium, titanium nitride, aluminum silicon, titanium, and titanium nitride in order from the bottom or a stacked-layer structure of more than five layers.

As the conductive films 740, 742, 744, and 746, tungsten silicide formed by a chemical vapor deposition method using a $WF_6$ gas and a $SiH_4$ gas may be used. Alternatively, tungsten formed by hydrogen reduction of $WF_6$ may be used as the conductive films 740, 742, 744, and 746.

Note that the conductive films 740 and 742 are connected to the high-concentration impurity regions 720 of the n-channel transistor 732. The conductive films 744 and 746 are connected to the high-concentration impurity regions 726 of the p-channel transistor 734.

Figure 14A:
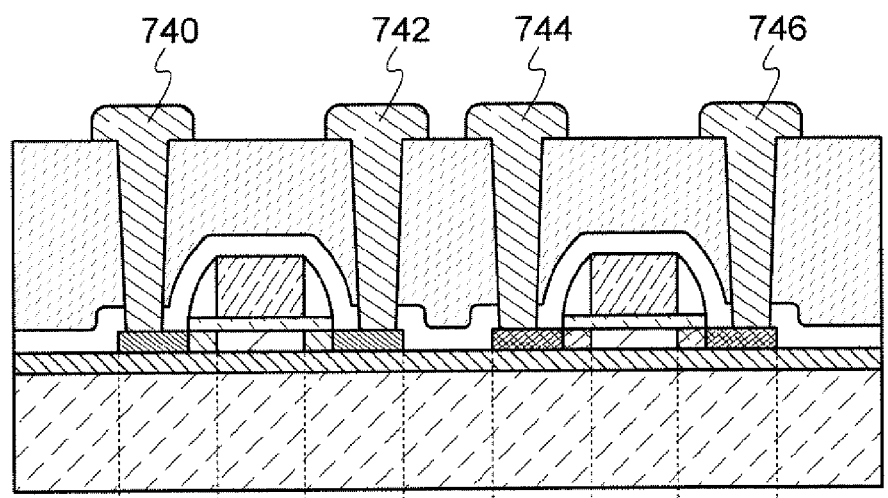
FIGS. 14A and 14B are cross-sectional views illustrating an example of a method for manufacturing a semiconductor device.
Figure 14B:
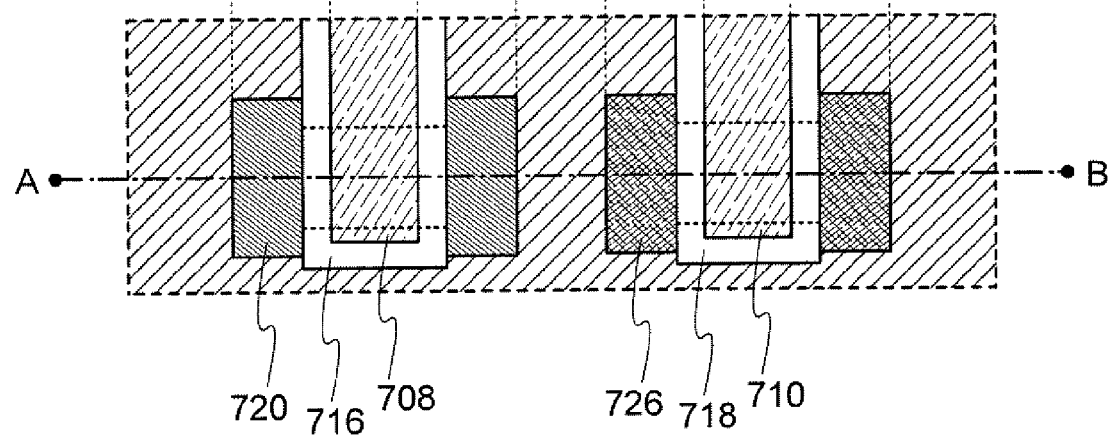

FIG. 14B is a plan view of the n-channel transistor 732 and the p-channel transistor 734 which are illustrated in FIG. 14A. Here, a cross section taken along line A-B in FIG. 14B corresponds to FIG. 14A. Note that in FIG. 14B, the conductive films 740, 742, 744, and 746, the insulating films 736 and 738, and the like are omitted for simplicity.

Note that although the case where the n-channel transistor 732 and the p-channel transistor 734 each include one electrode serving as a gate electrode (the case where the n-channel transistor 732 and the p-channel transistor 734 include the electrodes 708 and 710) is described in this embodiment as an example, one embodiment of the disclosed invention is not limited to this structure. The transistors may have a multi-gate structure in which a plurality of electrodes serving as gate electrodes are included and electrically connected to one another.

In this embodiment, an SOI substrate having an excellent semiconductor layer where the surface roughness is suppressed is used; therefore, the manufacturing yield of semiconductor devices can be improved. Note that the structure described in this embodiment can be used in appropriate combination with any of structures described in the other embodiments.

Embodiment 5

In this embodiment, a variety of electronic devices to which an SOI substrate according to the present invention is applied will be described. The electronic devices include, in its category, cameras such as video cameras and digital cameras, navigation systems, audio reproducing devices (such as car audio sets and audio components) computers, game machines, portable information terminals (such as mobile computers, cellular phones, portable game machines, and e-book readers), and image reproducing devices having recording media (specifically, devices provided with display devices capable of playing audio data stored in recording media such as a digital versatile disc (DVD) and displaying stored image data). Examples of these devices are illustrated in FIGS. 15A to 15F.

Figure 15A:
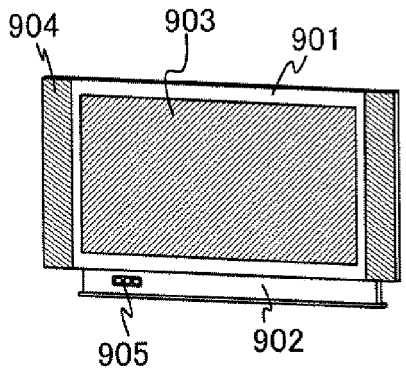
FIGS. 15A to 15F are views each illustrating an electronic device according to one embodiment of the present invention.

FIG. 15A illustrates a display device including a housing 901, a supporting base 902, a display portion 903, speaker portions 904, a video input terminal 905, and the like. This display device is manufactured using the transistors formed by the manufacturing method described in another embodiment for a driver IC, the display portion 903, and the like. Note that the display device refers to a liquid crystal display device, a light-emitting display device, and the like, and all the information display devices for, for example, computers, television reception, and advertisement display can be included. Specifically, a display, a head-mounted display, a reflection type projector, and the like can be given. By applying the SOI substrate according to the present invention to the display portion of the display device, the display portion can be made to have little display unevenness and excellent image quality. Further, by applying the SOI substrate according to the present invention to the driver IC, the driver IC can be made to have high driving capability.

Figure 15B:
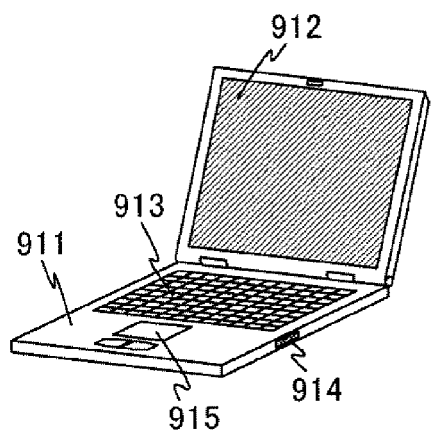

FIG. 15B illustrates a computer including a housing 911, a display portion 912, a keyboard 913, an external connection port 914, a pointing device 915, and the like. A transistor formed according to the present invention can be applied not only to a pixel portion in the display portion 912 but also to a semiconductor device such as a driver IC for display, a CPU inside a main body, or a memory.

Figure 15C:
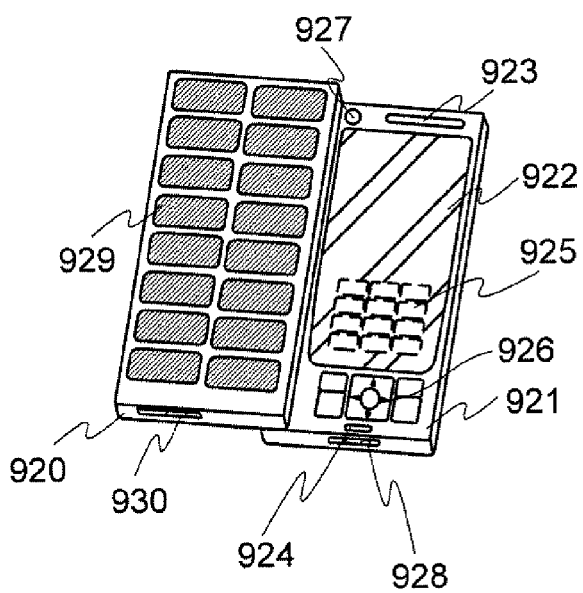

FIG. 15C illustrates a mobile phone which includes two housings: a housing 920 and a housing 921. The housing 921 includes a display panel 922, a speaker 923, a microphone 924, a pointing device 926, a camera lens 927, an external connection terminal 928, and the like. The housing 920 is provided with a solar cell 929 for charging the mobile phone, an external memory slot 930, and the like. In addition, an antenna is incorporated in the housing 921. Further, the display panel 922 is provided with a touch panel. A plurality of operation keys 925 which is displayed as images is illustrated by dashed lines in FIG. 15C. Note that a boosting circuit by which a voltage output from the solar cell 929 is increased to be sufficiently high for each circuit is also included.

A semiconductor material formed according to the present invention can be used for electronic devices such as a PDA (a personal digital assistant or a portable information processing terminals), a digital camera, a compact game machine, or a portable audio playback device, in addition to the above mobile phone. For example, the semiconductor material of the present invention can be used for forming a functional circuit such as a CPU, a memory, or a sensor or to a pixel portion or a driver IC for display of those electronic devices.

Figure 15D:
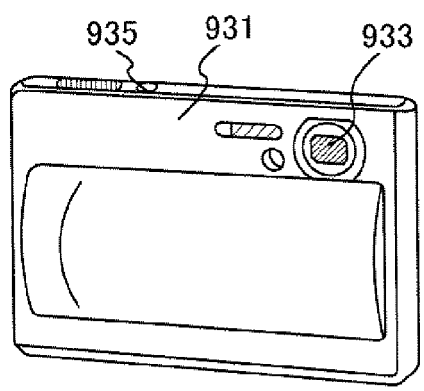
Figure 15E:
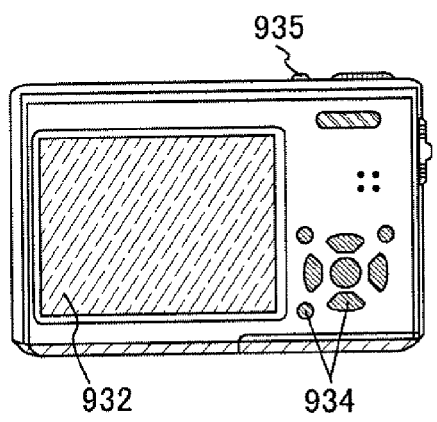

FIGS. 15D and 15E illustrate a digital camera. FIG. 15E illustrates a rear side of the digital camera illustrated in FIG. 15D. This digital camera includes a housing 931, a display portion 932, a lens 933, an operation key 934, a shutter button 935, and the like. A transistor formed according to the present invention can be applied to a pixel portion in the display portion 932, a driver IC for driving the display portion 932, a memory, and the like.

Figure 15F:
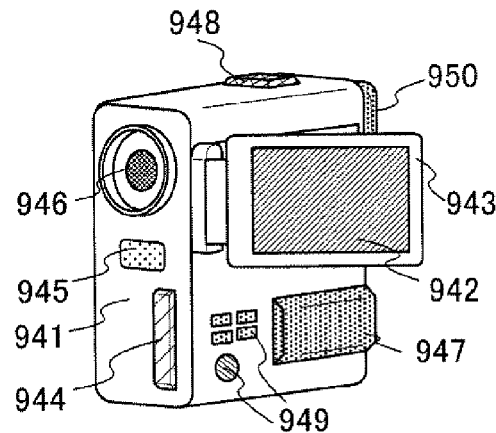

FIG. 15F illustrates a digital video camera. This digital video camera includes a main body 941, a display portion 942, a housing 943, an external connection port 944, a remote control receiving portion 945, an image receiving portion 946, a battery 947, an audio input portion 948, an operation key 949, an eye piece portion 950, and the like. A transistor formed according to the present invention can be applied to a pixel portion in the display portion 942, a driver IC for driving the display portion 942, a memory, a digital input processing device, and the like.

Besides, a transistor formed according to the present invention can be applied to a navigation system, an audio playback device, an image reproducing device provided with a recording medium, and the like. A transistor manufactured according to the present invention can be applied to a pixel portion in a display portion, a driver IC for controlling the display portion, a memory, a digital input processing device, a sensor portion, and the like of those devices.

Further, the electronic devices illustrated in FIGS. 15A to 15F can be manufactured by application of the aforementioned method for manufacturing a transistor and a display device.

This application is based on Japanese Patent Application serial no. 2009-266067 filed with Japan Patent Office on Nov. 24, 2009, the entire contents of which are hereby incorporated by reference.

What is claimed is:

1. A method for manufacturing an SOI substrate, comprising the steps of:

providing a groove in a semiconductor substrate to penetrate the semiconductor substrate from a front surface to a rear surface opposite to the front surface;

irradiating the semiconductor substrate provided with the groove with an ion from the front surface to form an embrittled region in the semiconductor substrate;

bonding the semiconductor substrate and a base substrate to each other with an insulating layer interposed therebetween; and performing a heat treatment to separate the semiconductor substrate at the embrittled region, so that a semiconductor layer is formed over the base substrate with the insulating layer interposed therebetween, and wherein the groove is provided before bonding the semiconductor substrate and the base substrate to each other.

2. The method for manufacturing an SOI substrate according to claim 1, wherein the semiconductor substrate and the base substrate are not bonded to each other at the groove.

3. The method for manufacturing an SOI substrate according to claim 1, wherein the groove has a cylindrical shape or a polygonal columnar shape.

4. A method for manufacturing an SOI substrate, comprising:

a first step in which a semiconductor substrate is provided a groove to penetrate the semiconductor substrate from a front surface to a rear surface opposite to the front surface;

a second step in which the semiconductor substrate provided with the groove is irradiated with an ion from the front surface so that an embrittled region is formed in the semiconductor substrate;

a third step in which the semiconductor substrate and a base substrate are bonded to each other with an insulating layer interposed therebetween;

a fourth step in which the semiconductor substrate is separated at the embrittled region to form a semiconductor layer over the base substrate with the insulating layer interposed therebetween; and a fifth step in which the semiconductor substrate is reprocessed by a reprocessing treatment to provide a smooth surface in the front surface, wherein the second to fourth steps are repeated one time after the fifth step, and wherein the first step is performed only one time.

5. A method for manufacturing an SOI substrate, comprising the steps of:

a first step of providing a groove which is deeper than half of a thickness of a semiconductor substrate in a front surface of the semiconductor substrate opposite to the front surface;

a second step of forming an insulating layer over the semiconductor substrate;

a third step of irradiating the semiconductor substrate provided with the insulating layer and the groove with an ion from the front surface to form an embrittled region;

a fourth step of bonding the semiconductor substrate and a base substrate to each other with the insulating layer interposed therebetween;

a fifth step of performing a heat treatment to separate the semiconductor substrate at the embrittled region, so that a semiconductor layer is formed over the base substrate with the insulating layer interposed therebetween; and a sixth step of performing a reprocessing treatment to have a smooth surface in the front surface, wherein the second to fifth steps are repeated one time after the sixth step, and wherein the first step is performed only one time.

6. The method for manufacturing an SOI substrate according to claim 5, wherein the semiconductor substrate and the base substrate are not bonded to each other at the groove.

7. The method for manufacturing an SOI substrate according to claim 5, wherein the groove has a conical shape or a polygonal pyramidal shape.

8. The method for manufacturing an SOI substrate according to claim 5, wherein the groove has a polygonal pyramidal shape whose width is gradually narrowed from a surface of the semiconductor substrate toward an inside.

9. The method for manufacturing an SOI substrate according to claim 5, wherein the groove has a cylindrical shape or a polygonal columnar shape.

* * * * *